US012588350B2

(12) United States Patent
Kim et al.

(10) Patent No.: US 12,588,350 B2
(45) Date of Patent: Mar. 24, 2026

(54) DISPLAY DEVICE

(71) Applicant: Samsung Display Co., Ltd., Yongin-si (KR)

(72) Inventors: Suk Kim, Yongin-si (KR); Hyoungwook Jang, Yongin-si (KR); Sung-Soo Bae, Yongin-si (KR); Jae-Kyoung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/811,657

(22) Filed: Aug. 21, 2024

(65) Prior Publication Data

US 2025/0120244 A1    Apr. 10, 2025

(30) Foreign Application Priority Data

Oct. 5, 2023    (KR) ........................ 10-2023-0132320

(51) Int. Cl.
| | |
|---|---|
| *H10K 39/34* | (2023.01) |
| *G06V 40/13* | (2022.01) |
| *G09G 3/3233* | (2016.01) |
| *H10K 59/00* | (2023.01) |
| *H10K 101/40* | (2023.01) |

(52) U.S. Cl.
CPC ......... *H10K 39/34* (2023.02); *G06V 40/1318* (2022.01); *G09G 3/3233* (2013.01);
(Continued)

(58) Field of Classification Search
CPC .............. E04B 1/19; E04B 2001/1927; E04B 2001/196; E04B 2001/1978; E04B 2001/2415; E04B 2001/2451; E04B 2001/2472; E04C 2003/0495; E04C 3/02; E04C 3/08; F16M 13/02; G06V 40/1318; G09G 2300/0819; G09G 2300/0842; G09G 2300/0861; G09G 2310/08;
(Continued)

(56) References Cited

U.S. PATENT DOCUMENTS

| | | | |
|---|---|---|---|
| 8,796,699 B2 | 8/2014 | So et al. |
| 9,006,752 B2 | 4/2015 | So et al. |

(Continued)

FOREIGN PATENT DOCUMENTS

| | | | |
|---|---|---|---|
| JP | 2006-013103 A2 | 1/2006 |
| JP | 2013-512439 A | 4/2013 |
| WO | WO 2011/066396 A2 | 6/2011 |

*Primary Examiner* — Nitin Patel
*Assistant Examiner* — Amen W Bogale
(74) *Attorney, Agent, or Firm* — Womble Bond Dickinson (US) LLP

(57) ABSTRACT

A display device includes: a base layer; a circuit layer on the base layer; and an element layer on the circuit layer and including a light emitting element and a hybrid element, wherein the hybrid element includes: a hybrid anode electrode; a light receiving stack on the hybrid anode electrode; a light emitting stack on the light receiving stack; and a hybrid cathode electrode on the light emitting stack, wherein the light emitting element is configured to be turned on to emit a first color light in a light emitting mode and a light receiving mode, wherein the hybrid element is configured to be turned on to output a second color light in the light emitting mode, and wherein the hybrid element is configured to be turned on to receive the first color light in the light receiving mode.

19 Claims, 15 Drawing Sheets

<Light Emitting Mode>

<Light Receiving Mode>

(52) U.S. Cl.
CPC ... *H10K 59/771* (2023.02); *G09G 2300/0819* (2013.01); *G09G 2300/0842* (2013.01); *G09G 2300/0861* (2013.01); *G09G 2310/08* (2013.01); *G09G 2360/14* (2013.01); *H10K 2101/40* (2023.02)

(58) Field of Classification Search
CPC ............. G09G 2360/14; G09G 3/3233; H10K 2101/40; H10K 39/34; H10K 59/771; H10K 50/13; H10K 59/38; H10K 65/00
See application file for complete search history.

(56) References Cited

U.S. PATENT DOCUMENTS

| | | | |
|---|---|---|---|
| 10,700,141 B2 | 6/2020 | So | |
| 11,257,424 B2 * | 2/2022 | Baumheinrich | ..... G09G 3/3225 |
| 11,487,373 B2 | 11/2022 | Kubota et al. | |
| 11,854,294 B2 * | 12/2023 | Park | ................... G06V 40/1318 |
| 2010/0181552 A1 | 7/2010 | So | |
| 2017/0221969 A1 * | 8/2017 | Steckel | .................. H10K 59/32 |
| 2018/0219047 A1 * | 8/2018 | Tokuhara | .................. G01J 5/24 |
| 2019/0013368 A1 * | 1/2019 | Chung | .................. H10K 39/34 |
| 2020/0111851 A1 * | 4/2020 | Park | .................... G06F 3/0412 |
| 2021/0397806 A1 * | 12/2021 | Lu | ........................ G06V 10/143 |
| 2022/0278177 A1 * | 9/2022 | Kubota | ............. G06V 40/1318 |
| 2023/0111407 A1 * | 4/2023 | Ran | ........................ H10K 59/60 257/40 |
| 2023/0247873 A1 * | 8/2023 | Kubota | .................... G09F 9/00 257/40 |
| 2023/0309364 A1 * | 9/2023 | Yamazaki | .............. G09F 9/302 |
| 2024/0295765 A1 * | 9/2024 | Kim | .................. G06V 40/1318 |
| 2024/0324392 A1 * | 9/2024 | Yamazaki | ............. H10K 39/34 |
| 2024/0349579 A1 * | 10/2024 | Ikeda | ...................... H10F 30/20 |
| 2025/0239203 A1 * | 7/2025 | Oh | ........................ G09G 3/3233 |

* cited by examiner

Figure 3:
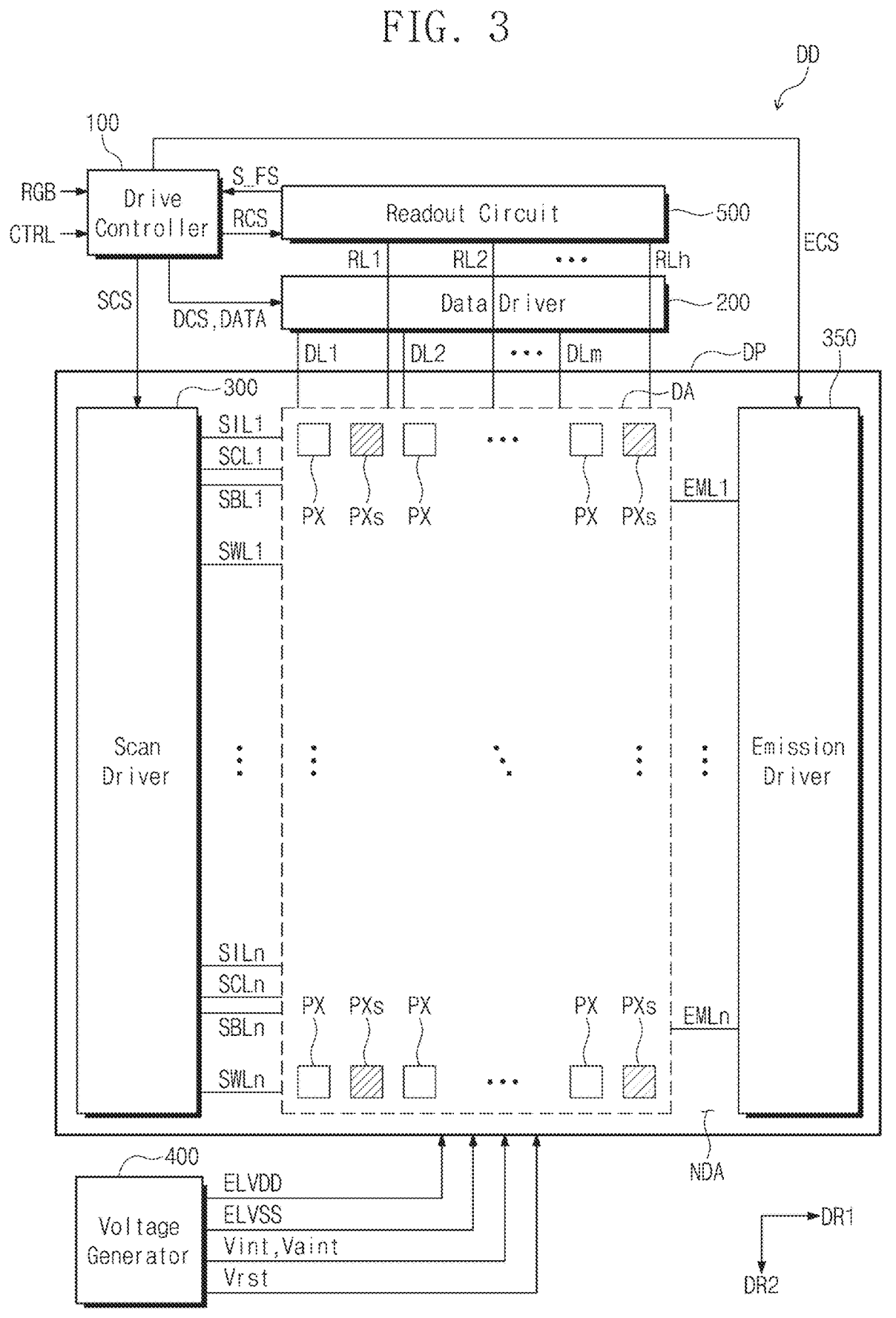

RGB →
CTRL →

Drive Controller

S_FS

RCS

Readout Circuit — 500

ECS

SCS

DCS,DATA

RL1    RL2    ...    RLh

Data Driver — 200

DL1    DL2    ...    DLm

DP

DA

350

300

SIL1

SCL1

SBL1

SWL1

Scan Driver

PX  PXs  PX    ...    PX  PXs

EML1

Emission Driver

SILn

SCLn

SBLn

SWLn

PX  PXs  PX    ...    PX  PXs

EMLn

NDA

400

Voltage Generator

ELVDD

ELVSS

Vint,Vaint

Vrst

DR1

DR2

<Light Emitting Mode>

<Light Receiving Mode>

FIG. 8A

<Light Emitting Mode>

ETR2

G2_EML

HTR2

ETR1    n-CGL

HBL

Lg1

OCL

EBL p-CGL

\<Light Receiving Mode\>

DISPLAY DEVICE

CROSS-REFERENCE TO RELATED APPLICATION

The present application claims priority to and the benefit of Korean Patent Application No. 10-2023-0132320, filed on Oct. 5, 2023, in the Korean Intellectual Property Office, the entire disclosure of which is incorporated herein by reference.

BACKGROUND

1. Field

Aspects of some embodiments of the present disclosure relate to a display device.

2. Description of the Related Art

A display device displays images to provide information to users or provides various functions, which enable organic communication with users, such as a function of sensing an input of users. Nowadays, the display device includes a function of sensing biometric information of users.

The biometric information may be recognized by using a capacitive method of sensing a change in capacitance formed between electrodes, an optical method of sensing an incident light through a light sensor, an ultrasonic method of sensing vibration by utilizing a piezoelectric body or the like.

The above information disclosed in this Background section is only for enhancement of understanding of the background and therefore the information discussed in this Background section does not necessarily constitute prior art.

SUMMARY

Aspects of some embodiments of the present disclosure relate to a display device with a function of recognizing biometric information.

Aspects of some embodiments of the present disclosure include a display device capable of recognizing biometric information while preventing a resolution from decreasing.

According to some embodiments, a display device includes a base layer, a circuit layer on the base layer, and an element layer on the circuit layer and including a light emitting element and a hybrid element.

According to some embodiments, the hybrid element includes a hybrid anode electrode, a light receiving stack on the hybrid anode electrode, a light emitting stack on the light receiving stack, and a hybrid cathode electrode on the light emitting stack.

According to some embodiments, in a light emitting mode and a light receiving mode, the light emitting element is turned on to emit a first color light. In the light emitting mode, the hybrid element is turned on to output a second color light. In the light receiving mode, the hybrid element is turned on to receive the first color light.

According to some embodiments, a display device includes a base layer, a circuit layer on the base layer, and an element layer on the circuit layer and including a light emitting element and a hybrid element.

According to some embodiments, the circuit layer includes a pixel circuit connected to the light emitting element, a pixel circuit unit connected to the hybrid element and being identical to the pixel circuit in circuit structure, and a sensor circuit unit connected to the hybrid element and the pixel circuit unit.

According to some embodiments, the hybrid element includes a light emitting unit turned on by the pixel circuit unit in a reverse bias state, and a light receiving unit turned on by the sensor circuit unit in a forward bias state.

BRIEF DESCRIPTION OF THE DRAWINGS

The above and other aspects and features of embodiments according to the present disclosure will become more apparent by describing in more detail aspects of some embodiments thereof with reference to the accompanying drawings.

FIG. 3 is a block diagram of a display device according to some embodiments of the present disclosure.

FIG. 8A is a conceptual diagram illustrating the case where a hybrid pixel according to some embodiments of the present disclosure operates in a light emitting mode.

FIG. 8B is a conceptual diagram illustrating the case where a hybrid pixel according to some embodiments of the present disclosure operates in a light receiving mode.

DETAILED DESCRIPTION

Figure 1:
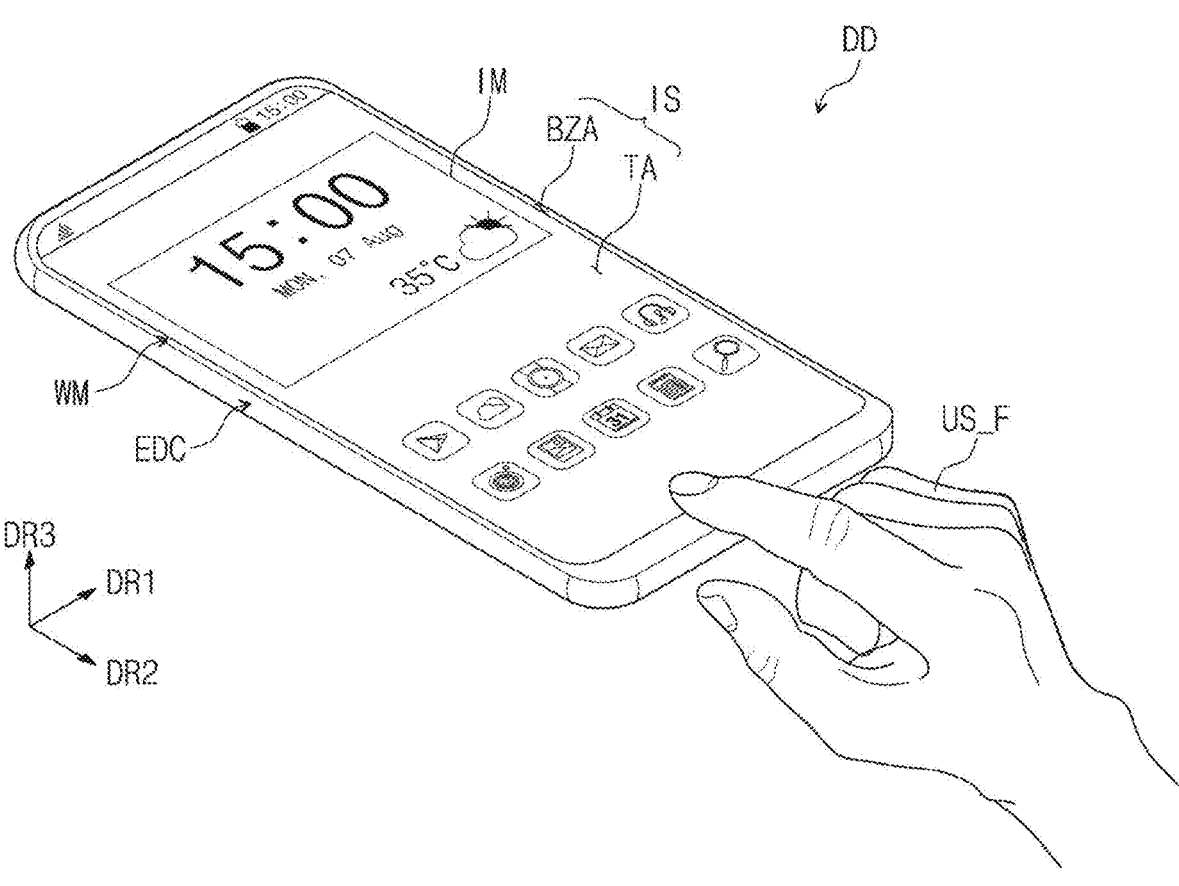
FIG. 1 is a perspective view illustrating a display device according to some embodiments of the present disclosure.

In the specification, the expression that a first component (or an area, a layer, a part, or a portion) is "on", "connected to", or "coupled to" a second component means that the first component is directly on/connected to/coupled to the second component or means that a third component is interposed therebetween.

The same reference numerals refer to the same components. Also, in drawings, the thickness, ratio, and dimension of components are exaggerated for effectiveness of description of technical contents. The term "and/or" includes one or more combinations in each of which associated elements are defined.

Although the terms "first", "second", etc. may be used to describe various components, the components should not be construed as being limited by the terms. The terms are only used to distinguish one component from another component. For example, without departing from the scope and spirit of the invention, a first component may be referred to as a "second component", and similarly, the second component may be referred to as the "first component". The articles "a", "an", and "the" are singular in that they have a single referent, but the use of the singular form in the specification should not preclude the presence of more than one referent.

Also, the terms "under", "below", "on", "above", etc. are used to describe the correlation of components illustrated in drawings. The terms are relative and are described with respect to a direction indicated in the drawing.

It will be further understood that the terms "comprises", "includes", "have", etc. specify the presence of stated features, numbers, steps, operations, elements, components, or a combination thereof but do not preclude the presence or addition of one or more other features, numbers, steps, operations, elements, components, or a combination thereof.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Figure 2:
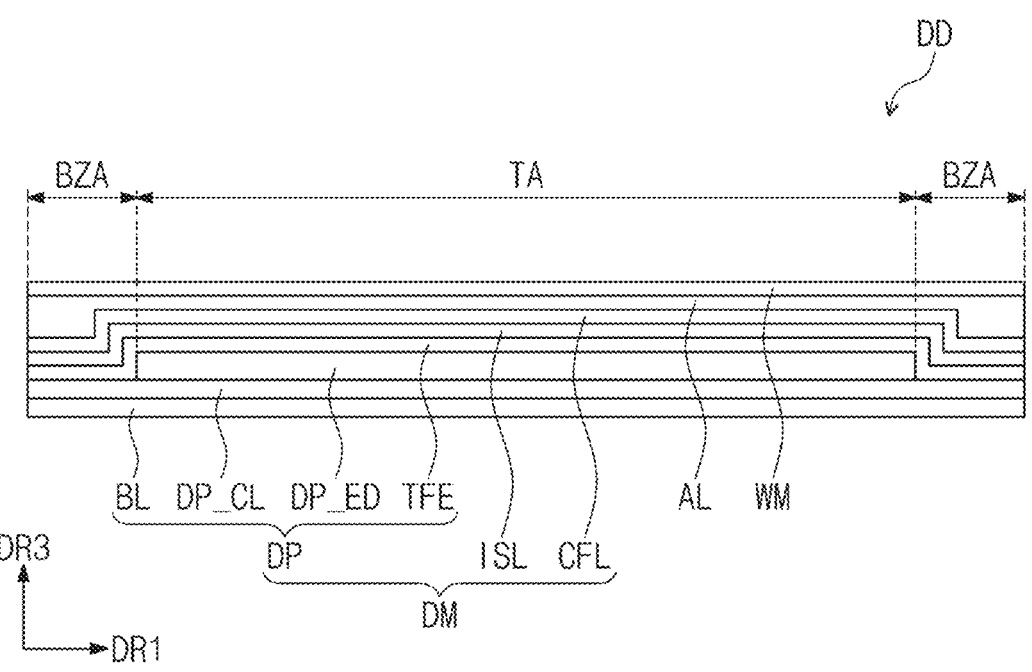
FIG. 2 is a cross-sectional view of a display device according to some embodiments of the present disclosure.

FIG. 1 is a perspective view of a display device according to some embodiments of the present disclosure, and FIG. 2 is a cross-sectional view of a display device according to some embodiments of the present disclosure.

Referring to FIGS. 1 and 2, a display device DD may be in the shape of a rectangle having a short side (or edge) parallel to a first direction DR1 and a long side (or edge) parallel to a second direction DR2 intersecting the first direction DR1. According to some embodiments, the display device DD may have rounded corners at the junction between the short and long sides. However, embodiments according to the present disclosure are not limited thereto. For example, the display device DD may be implemented in various shapes such as a circle and a polygon, or any other suitable shape according to the design of the display device DD.

The display device DD may be a device that is activated depending on an electrical signal. The display device DD may include various embodiments. For example, the display device DD may be applied to an electronic device such as a smart watch, a tablet PC, a notebook computer, a computer, or a smart television.

Below, the normal direction that is substantially perpendicular to a plane defined by the first direction DR1 and the second direction DR2 is defined as a third direction DR3. In the specification, the expression "when viewed from above a plane" or "in a plan view" may mean "when viewed from the third direction DR3".

An upper surface of the display device DD may be defined as a display surface IS and may be parallel to the plane defined by the first direction DR1 and the second direction DR2. Images IM generated by the display device DD may be provided to the user through the display surface IS.

The display surface IS may be divided into a transparent area TA and a bezel area BZA. The transparent area TA may be an area at which the images IM are displayed. The user visually perceives the images IM through the transparent area TA. According to some embodiments, the transparent area TA is illustrated in the shape of a quadrangle whose vertexes are rounded. However, this is provided as an example. The transparent area TA may be implemented in various shapes (e.g., circle, ellipse, or any other suitable shape according to the design of the display device DD) and may not be limited to any one embodiment.

The bezel area BZA is adjacent to the transparent area TA. The bezel area BZA may have a given color. The bezel area BZA may surround the transparent area TA. As such, the shape of the transparent area TA may be defined substantially by the bezel area BZA. However, this is provided as an example. The bezel area BZA may be located adjacent to only one side of the transparent area TA or may be omitted.

The display device DD may sense an external input applied from the outside or from an external source (e.g., a touch input). The external input may include various types of inputs that are provided from the outside of the display device DD. For example, as well as a contact by a part of the human body such as the user's hand US_F or a contact by a separate device (e.g., an active pen or a digitizer), the external input may include an external input (e.g., hovering) that is applied in a state where the user's hand US_F approaches the display device DD or is close to the display device DD within a given distance. Also, the external input may have various types such as a force type, a pressure type, a temperature type, and a light type.

The display device DD may sense biometric information of the user, which is applied from the outside. A biometric information sensing area capable of sensing the biometric information of the user may be provided on the display surface IS of the display device DD. The biometric information sensing area may be provided in the whole area of the transparent area TA or may be provided in a partial area of the transparent area TA. An example of the present disclosure is illustrated in FIG. 1 as the whole transparent area TA is utilized as the biometric information sensing area.

The display device DD may include a window WM, a display module DM, and a housing EDC. According to some embodiments, the appearance of the display device DD may be implemented by coupling the window WM and the housing EDC.

A front surface of the window WM defines the display surface IS of the display device DD. The window WM may include an optically transparent material. For example, the window WM may include glass or plastic. The window WM may be of a multi-layer structure or a single-layer structure. For example, the window WM may include a plurality of plastic films bonded to each other by an adhesive or may have a glass substrate and a plastic film bonded to each other by an adhesive.

The display module DM may include a display panel DP and an input sensing layer ISL. The display panel DP may display images depending on an electrical signal, and the input sensing layer ISL may sense an external input applied from the outside. The external input may be provided in various forms.

The display panel DP according to some embodiments of the present disclosure may be a light emitting display panel but is not particularly limited thereto. For example, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include a quantum dot, a quantum rod, or the like. Below, the description will be given as the display panel DP is an organic light emitting display panel.

Referring to FIG. 2, the display panel DP includes a base layer BL, a circuit layer DP_CL, an element layer DP_ED, and an encapsulation layer TFE. The display panel DP according to some embodiments of the present disclosure may be a flexible display panel. However, embodiments according to the present disclosure are not limited thereto. For example, the display panel DP may be a foldable display panel, which is folded about a folding axis, or a rigid display panel.

The base layer BL may include a synthetic resin layer. The synthetic resin layer may be a polyimide-based resin layer, and the material thereof is not particularly limited. Besides, the base layer BL may include a glass substrate, a metal substrate, an organic/inorganic composite material substrate, etc.

The circuit layer DP_CL is located on the base layer BL. The circuit layer DP_CL is located between the base layer BL and the element layer DP_ED. The circuit layer DP_CL includes at least one insulating layer and a circuit element. Below, the insulating layer included in the circuit layer DP_CL is referred to as an "intermediate insulating layer". The intermediate insulating layer includes at least one intermediate inorganic film and at least one intermediate organic film. The circuit element may include a normal pixel circuit included in each of a plurality of normal pixels for displaying images. Also, the circuit element may include a pixel circuit, a sensor circuit, etc., which are included in each of a plurality of hybrid pixels capable of recognizing external information and displaying images. The external information may be biometric information. As an example of the present disclosure, a sensor may include a fingerprint recognition sensor, a proximity sensor, an iris recognition sensor, a blood pressure measurement sensor, an illumination sensor, etc. Also, the sensor may include an optical sensor that recognizes biometric information in an optical method. The circuit layer DP_CL may further include signal lines connected to a pixel driving circuit and/or a sensor driving circuit.

The element layer DP_ED may include a light emitting element included in each of normal pixels PX (refer to FIG. 3) and a hybrid element included in each of hybrid pixels PXs (refer to FIG. 3). According to some embodiments of the present disclosure, the hybrid element may emit a light in a light emitting mode and may receive a light in a light receiving mode. In the light receiving mode, the hybrid element may react to or sense the light reflected by the user's fingerprint.

The encapsulation layer TFE seals up the element layer DP_ED. The encapsulation layer TFE may include at least one organic film and at least one inorganic film. The inorganic film may include an inorganic material and may protect the element layer DP_ED from moisture/oxygen. The inorganic layer may include a silicon nitride layer, a silicon oxy nitride layer, a silicon oxide layer, a titanium oxide layer, an aluminum oxide layer, etc. but embodiments according to the present disclosure are not particularly limited thereto. The organic film may include an organic material and may protect the element layer DP_ED from foreign objects such as dust particles.

The input sensing layer ISL may be formed on the display panel DP. The input sensing layer ISL may be directly located on the encapsulation layer TFE. According to some embodiments of the present disclosure, the input sensing layer ISL may be formed on the display panel DP through the same process as the display panel DP. That is, when the input sensing layer ISL is directly located on the display panel DP, an adhesive film is not located between the input sensing layer ISL and the encapsulation layer TFE. Alternatively, an adhesive film may be located between the input sensing layer ISL and the display panel DP. In this case, the input sensing layer ISL may not be manufactured by the same process as the display panel DP. For example, the input sensing layer ISL may be manufactured through a process independent of that of the display panel DP and may then be fixed on the upper surface of the display panel DP by the adhesive film.

The input sensing layer ISL may sense an external input (e.g., a touch of the user), may change the sensed input into a given input signal, and may provide the input signal to the display panel DP. The input sensing layer ISL may include a plurality of sensing electrodes for sensing an external input. The sensing electrodes may sense the external input in a capacitive method. The display panel DP may receive the input signal from the input sensing layer ISL and may generate images corresponding to the input signal.

The display module DM may further include a color filter layer CFL. As an example of the present disclosure, the color filter layer CFL may be located on the input sensing layer ISL. However, embodiments according to the present disclosure are not limited thereto. The color filter layer CFL may be located between the display panel DP and the input sensing layer ISL. The color filter layer CFL may include a plurality of color filters and a black matrix.

A structure of the input sensing layer ISL and the color filter layer CFL will be described in detail later.

The display device DD according to some embodiments of the present disclosure may further include an adhesive layer AL. The window WM may be attached to the input sensing layer ISL by the adhesive layer AL. The adhesive layer AL may include an optical clear adhesive, an optically clear adhesive resin, or a pressure sensitive adhesive (PSA).

The housing EDC is coupled to the window WM. The housing EDC is coupled to the window WM to provide a given inner space. The display module DM may be accommodated in the inner space. The housing EDC may include a material whose rigidity is relatively high. For example, the housing EDC may include glass, plastic, or metal or may include a plurality of frames and/or plates that are formed of a combination thereof. The housing EDC may stably protect the components of the display device DD, which are accommodated in the inner space, from an external impact. According to some embodiments, a battery module that supplies a power necessary for the overall operation of the display device DD may be located between the display module DM and the housing EDC.

FIG. 3 is a block diagram of a display device according to some embodiments of the present disclosure.

Referring to FIG. 3, the display device DD includes the display panel DP, a panel driver, and a drive controller 100. According to some embodiments of the present disclosure, the panel driver includes a data driver 200, a scan driver 300, an emission driver 350, a voltage generator 400, and a readout circuit 500.

The drive controller 100 receives an image signal RGB and a control signal CTRL. The drive controller 100 generates image data DATA by converting a data format of the image signal RGB in compliance with the specification for an interface with the data driver 200. The drive controller 100 outputs a first control signal SCS, a second control signal ECS, a third control signal DCS, and a fourth control signal RCS.

The data driver 200 receives the third control signal DCS and the image data DATA from the drive controller 100. The data driver 200 converts the image data DATA into data signals and outputs the data signals to a plurality of data lines DL1 to DLm to be described later. The data signals refer to analog voltages corresponding to gray values of the image data DATA.

The scan driver 300 receives the first control signal SCS from the drive controller 100. The scan driver 300 may output scan signals to scan lines in response to the first control signal SCS.

The voltage generator 400 generates voltages necessary for an operation of the display panel DP. According to some embodiments, the voltage generator 400 generates a first driving voltage ELVDD, a second driving voltage ELVSS, a first initialization voltage Vint, a second initialization voltage Vaint and a reset voltage Vrst.

The display panel DP may include a display area DA corresponding to the transparent area TA (illustrated in FIG. 1) and a non-display area NDA corresponding to the bezel area BZA (illustrated in FIG. 1) (e.g., outside a footprint or in a periphery of the display area DA).

The display panel DP may include the plurality of normal pixels PX located in the display area DA and the plurality of hybrid pixels PXs located in the display area DA. According to some embodiments of the present disclosure, each of the plurality of hybrid pixels PXs may be located adjacent to at least one of the normal pixels PX on the first direction DR1 or the second direction DR2. According to some embodiments of the present disclosure, the number of hybrid pixels PXs may be less than the number of normal pixels PX.

The display panel DP further includes initialization scan lines SIL1 to SILn, compensation scan lines SCL1 to SCLn, write scan lines SWL1 to SWLn, black scan lines SBL1 to SBLn, emission control lines EML1 to EMLn, the data lines DL1 to DLm, and readout lines RL1 to RLh. The initialization scan lines SIL1 to SILn, the compensation scan lines SCL1 to SCLn, the write scan lines SWL1 to SWLn, the black scan lines SBL1 to SBLn, and the emission control lines EML1 to EMLn extend in the first direction DR1. The initialization scan lines SIL1 to SILn, the compensation scan lines SCL1 to SCLn, the write scan lines SWL1 to SWLn, the black scan lines SBL1 to SBLn, and the emission control lines EML1 to EMLn are arranged to be spaced from each other in the second direction DR2. The data lines DL1 to DLm and the readout lines RL1 to RLh extend in the second direction DR2 and are arranged to be spaced from each other in the first direction DR1. Herein, n, m, and h are a natural number of 1 or more.

The plurality of normal pixels PX are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, and the data lines DL1 to DLm. For example, each of the plurality of normal pixels PX may be electrically connected to four scan lines. However, the number of scan lines connected to each normal pixel PX is not limited thereto and may be changed. One corresponding data line among the data lines DL1 to DLm is connected to each normal pixel PX. Herein, the normal pixels PX are pixels that are not connected to the readout lines RL1 to RLh.

The plurality of hybrid pixels PXs are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, the data lines DL1 to DLm, and the readout lines RL1 to RLh. Each of the plurality of hybrid pixels PXs may be electrically connected to four scan lines. One corresponding data line among the data lines DL1 to DLm and one corresponding readout line among the readout lines RL1 to RLh are electrically connected to each hybrid pixel PXs.

According to some embodiments of the present disclosure, the number of readout lines RL1 to RLh may be less than or equal to the number of data lines DL1 to DLm. For example, the number of readout lines RL1 to RLh may correspond to ½, ⅓, or ¼ of the number of data lines DL1 to DLm.

The scan driver 300 may be located in the non-display area NDA of the display panel DP. The scan driver 300 receives the first control signal SCS from the drive controller 100. In response to the first control signal SCS, the scan driver 300 outputs initialization scan signals to the initialization scan lines SIL1 to SILn and may output compensation scan signals to the compensation scan lines SCL1 to SCLn. Also, in response to the first control signal SCS, the scan driver 300 may output write scan signals to the write scan lines SWL1 to SWLn and may output black scan signals to the black scan lines SBL1 to SBLn. Alternatively, the scan driver 300 may include a first scan driver and a second scan driver. The first scan driver may output the initialization scan signals and the compensation scan signals, and the second scan driver may output the write scan signals and the black scan signals.

The emission driver 350 may be located in the non-display area NDA of the display panel DP. The emission driver 350 receives the second control signal ECS from the drive controller 100. The emission driver 350 may output emission control signals to the emission control lines EML1 to EMLn in response to the second control signal ECS. Alternatively, the scan driver 300 may be connected to the emission control lines EML1 to EMLn. In this case, the emission driver 350 may be omitted, and the scan driver 300 may output the emission control signals to the emission control lines EML1 to EMLn.

The readout circuit 500 receives the fourth control signal RCS from the drive controller 100. The readout circuit 500 may receive sensing signals from the readout lines RL1 to RLh in response to the fourth control signal RCS. The readout circuit 500 may process the sensing signals received from the readout lines RL1 to RLh and may provide sensing signals S_FS to the drive controller 100 as a processing result. The drive controller 100 may recognize biometric information based on the sensing signals S_FS.

Figure 4:
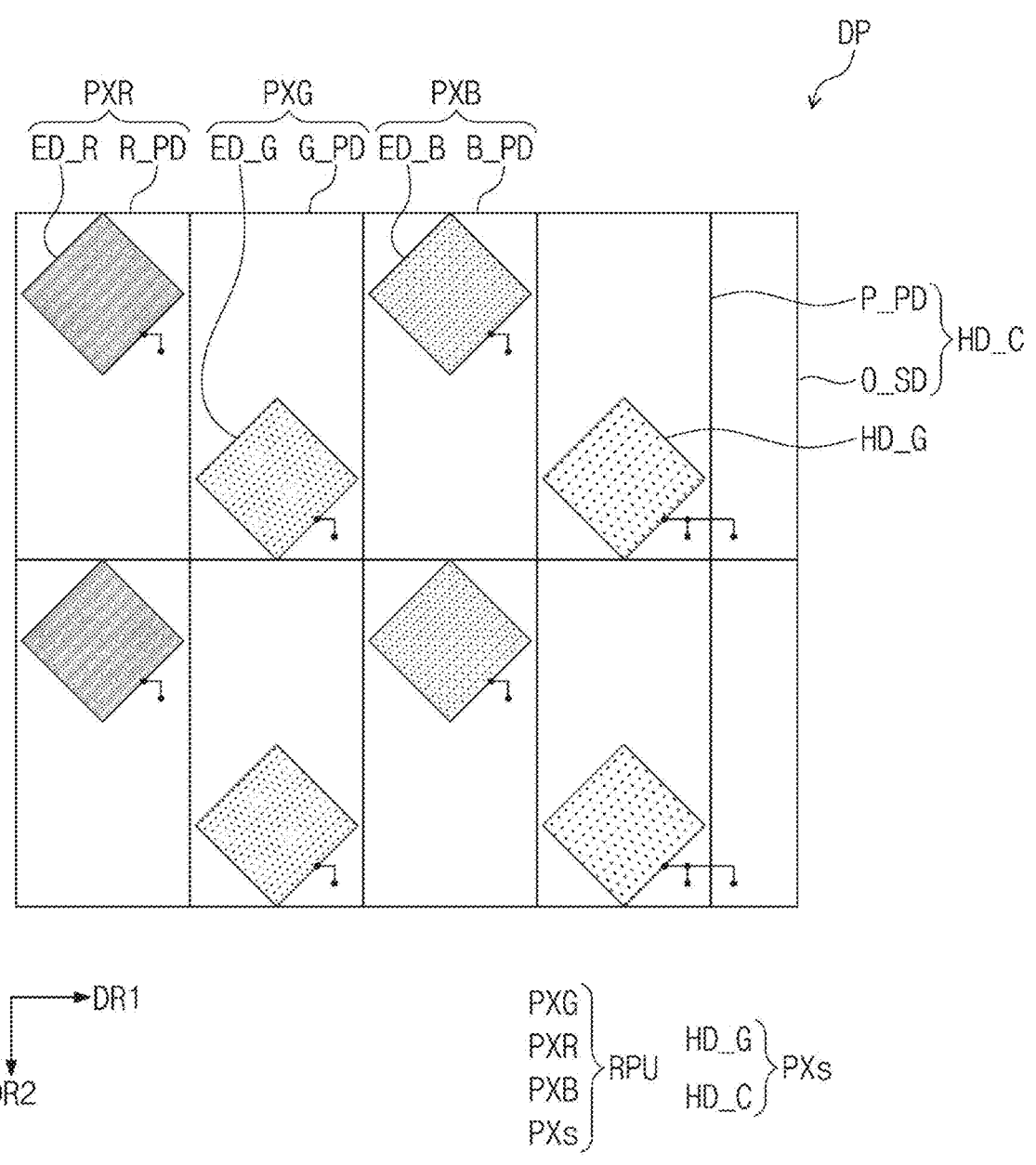
FIG. 4 is an enlarged plan view of a partial area of a display panel according to some embodiments of the present disclosure.

FIG. 4 is an enlarged plan view of a partial area of a display panel according to some embodiments of the present disclosure.

Referring to FIG. 4, the display panel DP includes a plurality of normal pixels PXG, PXR, and RXB and the plurality of hybrid pixels PXs.

The plurality of normal pixels PXG, PXR, and RXB and the plurality of hybrid pixels PXs may be grouped into a plurality of reference pixel units RPU. According to some embodiments of the present disclosure, each reference pixel unit RPU may include three normal pixels PXG, PXR, and RXB and one hybrid pixel PXs. The three normal pixels PXG, PXR, and RXB may be a first normal pixel PXG (hereinafter referred to as a "green normal pixel"), a second normal pixel PXR (hereinafter referred to as a "red normal pixel"), and a third normal pixel PXB (hereinafter referred to as a "blue normal pixel"). However, the number of normal pixels PXG, PXR, and RXB included in each reference pixel unit RPU is not limited thereto. Alternatively, each reference pixel unit RPU may include two normal pixels (i.e., the red normal pixel RXR and the blue normal pixel PXB) and two hybrid pixels (i.e., first and second hybrid pixels PXs1 and PXs2 (refer to FIG. 9)).

The green normal pixel PXG includes a green light emitting element ED_G. The red normal pixel RXR includes a red light emitting element ED_R, and the blue normal pixel PXB includes a blue light emitting element ED_B. The hybrid pixel PXs includes a hybrid element HD_G. According to some embodiments of the present disclosure, the green light emitting element ED_G outputs a first color light (or first green light) in the light emitting mode and the light receiving mode. The hybrid element HD_G outputs a second color light (or second green light) in the light emitting mode and receives the first color light in the light receiving mode. The first color light and the second color light may be light in the same wavelength range (e.g., a green wavelength range).

The red light emitting element ED_R outputs a third color light (e.g., red light) different from the first color light, and the blue light emitting element ED_B outputs a fourth color light (e.g., blue light) different from the first color light and the third color light. In the light emitting mode, the red and blue light emitting elements ED_R and ED_B output the third color light and the fourth color light, respectively. However, in the light receiving mode, the red and blue light emitting elements ED_R and ED_B may be turned off and may not emit the third color light and the fourth color light, respectively.

The red light emitting elements ED_R and the blue light emitting elements ED_B may be arranged repeatedly and alternately on the first direction DR1. The green light emitting elements ED_G and the hybrid elements HD_G are arranged repeatedly and alternately on the first direction DR1. The red light emitting elements ED_R are repeatedly arranged at the first column parallel to the second direction DR2, and the green light emitting elements ED_G are repeatedly arranged at the second column parallel to the second direction DR2. The blue light emitting elements ED_B are repeatedly arranged at the third column parallel to the second direction DR2, and the hybrid elements HD_G are repeatedly arranged at the fourth column parallel to the second direction DR2. The placement of the light emitting elements ED_G, ED_R, and ED_B is not limited thereto. For example, the red light emitting elements ED_R and the blue light emitting elements ED_B may be arranged repeatedly and alternately on the first and second directions DR1 and DR2.

According to some embodiments of the present disclosure, the size of the red light emitting elements ED_R may be larger than or equal to the size of the green light emitting elements ED_G. Also, the size of the blue light emitting elements ED_B may be larger than or equal to the size of the red light emitting elements ED_R. The size of each of the light emitting elements ED_G, ED_R, and ED_B is not limited thereto and may be variously changed and applied. According to some embodiments of the present disclosure, the light emitting elements ED_G, ED_R, and ED_B may have the same size. The size of the hybrid elements HD_G may be equal to or different from the size of the green light emitting elements ED_G.

The light emitting elements ED_G, ED_R, and ED_B may have the same shape. According to some embodiments of the present disclosure, each of the light emitting elements ED_G, ED_R, and ED_B may be in the shape of a rhombus. Alternatively, the light emitting elements ED_G, ED_R, and ED_B may be in the shape of a polygon (e.g., one of an octagon, a square, and a rectangle) or a circle. However, the present disclosure is not limited thereto. For example, the light emitting elements ED_G, ED_R, and ED_B may have different shapes. The hybrid element HD_G and the green light emitting element ED_G may have the same shape or different shapes. For example, the green light emitting element ED_G and the hybrid element HD_G may have the same size (or area) but may have different shapes. Also, the green light emitting element ED_G and the hybrid element HD_G may have different sizes (or areas) but may have the same shape.

The green light emitting element ED_G is electrically connected to a green pixel circuit G_PD (or a first normal pixel circuit). The red light emitting element ED_R is electrically connected to a red pixel circuit R_PD (or a second normal pixel circuit). The blue light emitting element ED_B is electrically connected to a blue pixel circuit B_PD (or a third normal pixel circuit). The red pixel circuit R_PD, the green pixel circuit G_PD, and the blue pixel circuit B_PD may be sequentially arranged in the first direction DR1. The hybrid element HD_G is electrically connected to a hybrid circuit HD_C. The hybrid circuit HD_C includes a pixel circuit unit P_PD and a sensor circuit unit O_SD. The hybrid element HD_G is connected in common to the pixel circuit unit P_PD and the sensor circuit unit O_SD.

The pixel circuit unit P_PD and the sensor circuit unit O_SD may be adjacent to each other on the first direction DR1. According to some embodiments of the present disclosure, the pixel circuit unit P_PD may be located between the blue pixel circuit B_PD and the sensor circuit unit O_SD.

Figure 5A:
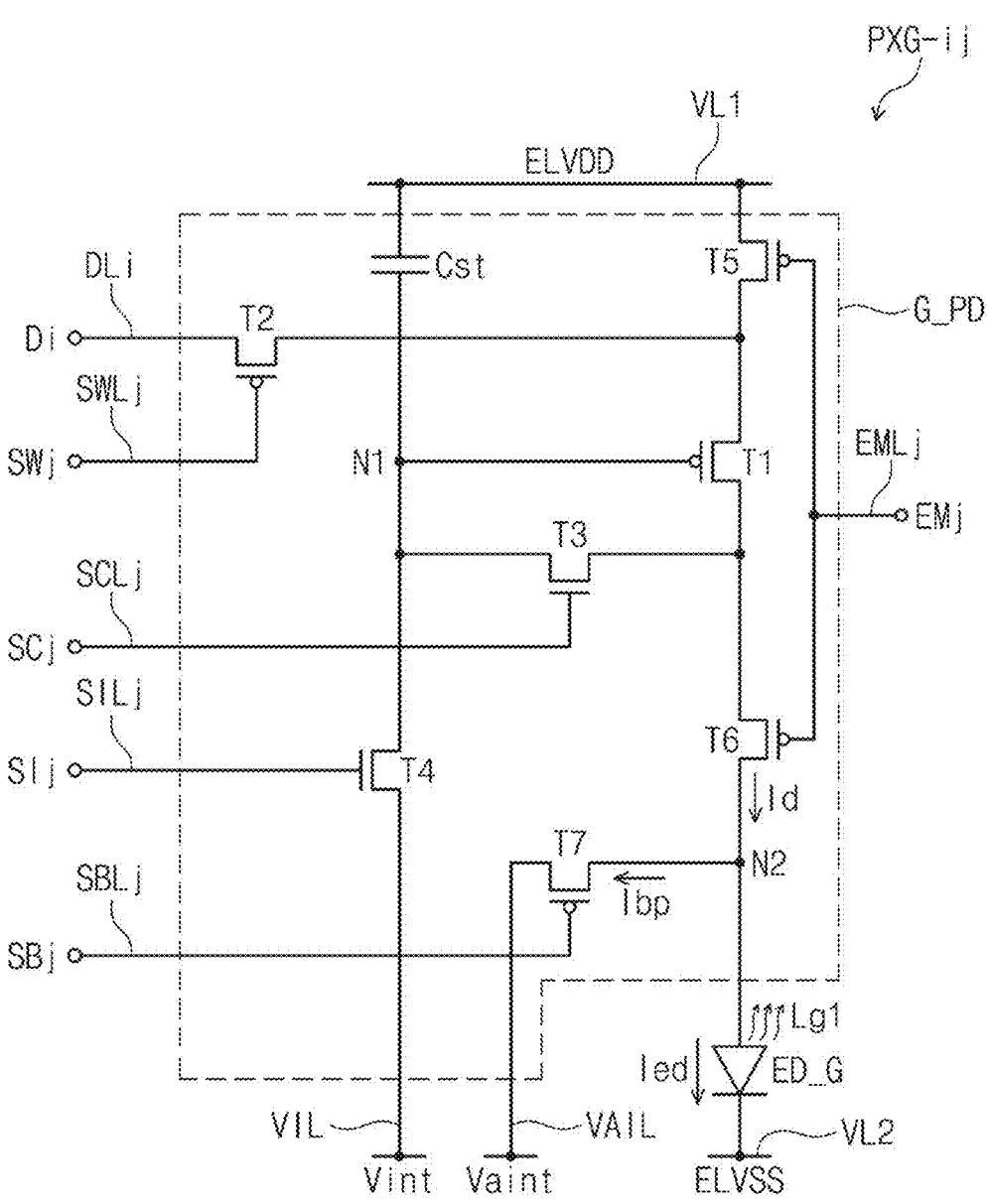
FIG. 5A is a circuit diagram illustrating a green normal pixel illustrated in FIG. 4.
Figure 5B:
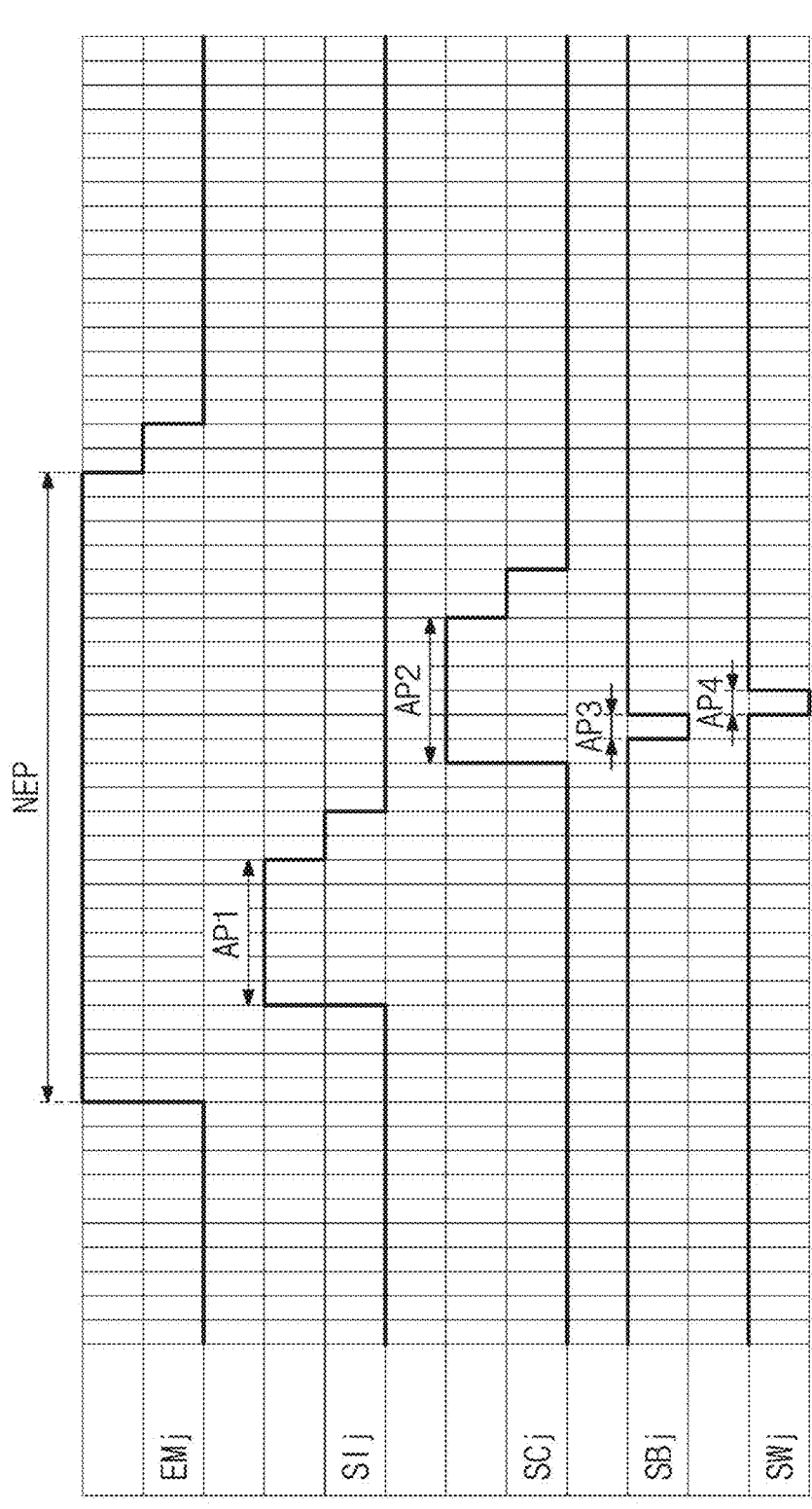
FIG. 5B is a waveform diagram for describing an operation of a green normal pixel illustrated in FIG. 5A.
Figure 5C:
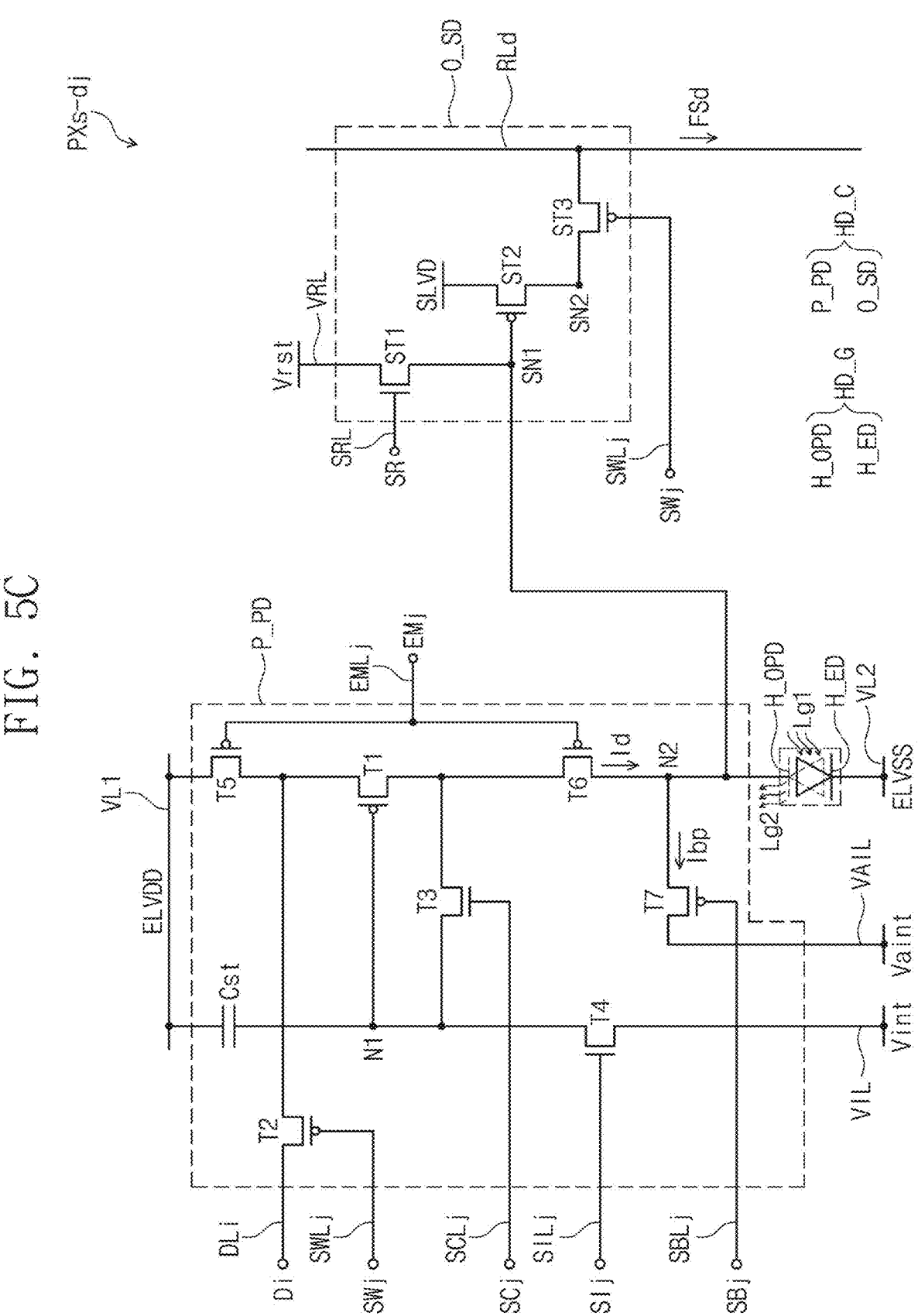
FIG. 5C is a circuit diagram illustrating a hybrid pixel illustrated in FIG. 4.

FIG. 5A is a circuit diagram illustrating a green normal pixel according to some embodiments of the present disclosure, and FIG. 5B is a waveform diagram for describing an operation of a green normal pixel illustrated in FIG. 5A. FIG. 5C is a circuit diagram illustrating the case where a hybrid pixel operates in a light emitting mode, according to some embodiments of the present disclosure, and FIG. 5D is a circuit diagram illustrating the case where a hybrid pixel operates in a light receiving mode, according to some embodiments of the present disclosure.

An equivalent circuit diagram of one pixel (e.g., a green normal pixel PXG-ij) among the plurality of normal pixels PX is illustrated in FIG. 3 is illustrated in FIG. 5A as an example. Because the plurality of normal pixels PX have the same circuit structure, a circuit structure of the green normal pixel PXG-ij will be described, and additional description associated with the remaining normal pixels may be omitted to avoid redundancy. Also, an equivalent circuit diagram of one hybrid pixel PXs-dj among the plurality of hybrid pixels PXs illustrated in FIG. 3 is illustrated in FIGS. 5C and 5D as an example. Because the plurality of hybrid pixels PXs have the same circuit structure, a circuit structure of the hybrid pixel PXs-dj will be described, and additional description associated with the remaining hybrid pixels may be omitted to avoid redundancy. Additionally, although various components are illustrated in FIG. 5A, embodiments according to the present disclosure are not limited thereto, and according to some embodiments, the pixel circuit illustrated in FIG. 5A may include additional components or fewer components without departing from the spirit and scope of embodiments according to the present disclosure.

Referring to FIG. 5A, the green normal pixel PXG-ij is connected to the i-th data line DLi of the data lines DL1 to DLm, the j-th initialization scan line SILj of the initialization scan lines SIL1 to SILn, the j-th compensation scan line SCLj of the compensation scan lines SCL1 to SCLn, the j-th write scan line SWLj of the write scan lines SWL1 to SWLn, the j-th black scan line SBLj of the black scan lines SBL1 to SBLn, and the j-th emission control line EMLj of the emission control lines EML1 to EMLn.

The green normal pixel PXG-ij includes the green light emitting element ED_G (or the first light emitting element) and the green pixel circuit G_PD (or the first normal pixel circuit). The green light emitting element ED_G may be a light emitting diode. As an example of the present disclosure, the green light emitting element ED_G may be an organic light emitting diode including an organic light emitting layer. The green light emitting element ED_G includes an anode electrode (or a first anode electrode), a cathode electrode, and a light emitting layer (or a first light emitting layer) located between the anode electrode and the cathode electrode.

The green pixel circuit G_PD includes first to seventh transistors T1, T2, T3, T4, T5, T6, and T7 and a one capacitor Cst. At least one of the first to seventh transistors T1 to T7 may be a transistor having a low-temperature polycrystalline silicon (LTPS) semiconductor layer. Some of the first to seventh transistors T1 to T7 may be P-type transistors, and the remaining transistors may be N-type transistors. At least one of the first to seventh transistors T1 to T7 may be a transistor having an oxide semiconductor layer. For example, the third and fourth transistors T3 and T4 may be oxide semiconductor transistors, and the first, second, fifth, sixth, and seventh transistors T1, T2, T5, T6, and T7 may be LTPS semiconductor transistors. The third and fourth transistors T3 and T4 may be NMOS transistors.

A configuration of the green pixel circuit G_PD according to the present disclosure is not limited to the embodiments illustrated and described with respect to FIG. 5A. The green pixel circuit G_PD illustrated in FIG. 5A is only an example, and the configuration of the green pixel circuit G_PD may be modified and implemented. For example, all of the first, second, and fifth to sixth transistors T1, T2, and T5 to T7 may be P-type transistors or N-type transistors.

The j-th initialization scan line SILj, the j-th compensation scan line SCLj, the j-th write scan line SWLj, the j-th black scan line SBLj, and the j-th emission control line EMLj may provide a j-th initialization scan signal SIj, a j-th compensation scan signal SCj, a j-th write scan signal SWj, a j-th black scan signal SBj, and a j-th emission control signal EMj to the green normal pixel PXG-ij. The i-th data line DLi provides an i-th data signal Di to the green normal pixel PXG-ij. The i-th data signal Di may have a voltage level corresponding to the image signal RGB (refer to FIG. 3) input to the display device DD (refer to FIG. 3).

According to some embodiments of the present disclosure, the green normal pixel PXG-ij may be connected to first and second driving voltage lines VL1 and VL2 and first and second initialization voltage lines VIL and VAIL. The first driving voltage line VL1 may provide the first driving voltage ELVDD to the green normal pixel PXG-ij, and the second driving voltage line VL2 may provide the second driving voltage ELVSS to the green normal pixel PXG-ij. Also, the first initialization voltage line VIL may provide the first initialization voltage Vint to the green normal pixel PXG-ij, and the second initialization voltage line VAIL may provide the second initialization voltage Vaint to the green normal pixel PXG-ij.

The first transistor T1 is connected between the first driving voltage line VL1 receiving the first driving voltage ELVDD and the green light emitting element ED_G. The first transistor T1 includes a first electrode connected to the first driving voltage line VL1 through the fifth transistor T5, a second electrode connected to an anode electrode of the green light emitting element ED_G through the sixth transistor T6, and a third electrode (e.g., a green cathode) connected to a first end of the capacitor Cst (e.g., a first node N1). The first transistor T1 may be supplied with the i-th data signal Di provided through the i-th data line DLi depending on a switching operation of the second transistor T2 and may supply a driving current Id to the green light emitting element ED_G.

The second transistor T2 is connected between the i-th data line DLi and the first electrode of the first transistor T1. The second transistor T2 includes a first electrode connected to the i-th data line DLi, a second electrode connected to the first electrode of the first transistor T1, and a third electrode (e.g., a gate electrode) connected to the j-th write scan line SWLj. The second transistor T2 may be turned on depending on the j-th write scan signal SWj transferred through the j-th write scan line SWLj and may transfer the i-th data signal Di transferred from the i-th data line DLi to the first electrode of the first transistor T1.

The third transistor T3 is connected between the second electrode of the first transistor T1 and the first node N1. The third transistor T3 may include a first electrode connected to the third electrode of the first transistor T1, a second electrode connected to the second electrode of the first transistor T1, and a third electrode connected to the j-th compensation scan line SCLj. The third transistor T3 may be turned on depending on the j-th compensation scan signal SCj transferred through the j-th compensation scan line SCLj and may connect the third electrode and the second electrode of the first transistor T1. In this case, the first transistor T1 may be diode-connected.

The fourth transistor T4 is connected between the first initialization voltage line VIL to which the first initialization voltage Vint is applied and the first node N1. The fourth transistor T4 includes a first electrode connected to the first initialization voltage line VIL through which the first initialization voltage Vint is transferred, a second electrode connected to the first node N1, and a third electrode connected with the j-th initialization scan line SILj. The fourth transistor T4 is turned on depending on the j-th initialization scan signal SIj transferred through the j-th initialization scan line SILj. The fourth transistor T4 thus turned on transfers the first initialization voltage Vint to the first node N1 such that a potential of the third electrode of the first transistor T1 (i.e., a potential of the first node N1) is initialized.

The fifth transistor T5 includes a first electrode connected to the first driving voltage line VL1, a second electrode connected to the first electrode of the first transistor T1, and a third electrode connected to the j-th emission control line EMLj.

The sixth transistor T6 may include a first electrode connected to the second electrode of the first transistor T1, a second electrode connected to the anode electrode of the green light emitting element ED_G (e.g., a second node N2), and a third electrode (e.g., a gate electrode) connected to the j-th emission control line EMLj.

The fifth and sixth transistors T5 and T6 are simultaneously turned on depending on the j-th emission control signal EMj transferred through the j-th emission control line EMLj. The first driving voltage ELVDD applied through the turned-on transistor T5 may be transferred to the green light emitting element ED_G after compensated for through the diode-connected transistor T1.

The seventh transistor T7 includes a first electrode connected to the second initialization voltage line VAIL through which the second initialization voltage Vaint is transferred, a second electrode connected to the second node N2, and a third electrode connected to the j-th black scan line SBLj. A voltage level of the second initialization voltage Vaint may lower than or equal to that of the first initialization voltage Vint.

The seventh transistor T7 is turned on depending on the j-th black scan signal SBj transferred through the j-th black scan line SBLj. The second initialization voltage Vaint applied through the seventh transistor T7 thus turned on may be transferred to the anode electrode of the green light emitting element ED_G. Accordingly, the anode electrode of the green light emitting element ED_G (or the second node N2) may be initialized with the second initialization voltage Vaint.

As described above, the first end of the capacitor Cst is connected to the third electrode of the first transistor T1, and a second end of the capacitor Cst is connected to the first driving voltage line VL1. A cathode electrode of the green light emitting element ED_G may be connected to the second driving voltage line VL2 transferring the second driving voltage ELVSS. A voltage level of the second driving voltage ELVSS may be lower than a voltage level of the first driving voltage ELVDD. According to some embodiments of the present disclosure, the voltage level of the second driving voltage ELVSS may be lower than the voltage levels of the first and second initialization voltages Vint and Vaint.

Referring to FIGS. 5A and 5B, the j-th emission control signal EMj has the high level during a non-emission period NEP. During the non-emission period NEP, the j-th initialization scan signal Slj is activated. During an active period AP1 (hereinafter referred to as a "first active period") of the j-th initialization scan signal Slj, when the j-th initialization scan signal Slj of the high level is provided through the j-th initialization scan line SILj, the fourth transistor T4 is turned on in response to the j-th initialization scan signal Slj of the high level. The first initialization voltage Vint is transferred to the third electrode of the first transistor T1 through the fourth transistor T4 thus turned on, and the first node N1 is initialized with the first initialization voltage Vint. Accordingly, the first active period AP1 may be defined as an initialization period of the green normal pixel PXG-ij.

Next, the j-th compensation scan signal SCj is activated; during an active period AP2 (hereinafter referred to as a "second active period") of the j-th compensation scan signal SCj, the third transistor T3 is turned on by the j-th compensation scan signal SCj of the high level supplied through the j-th compensation scan line SCLj. The first transistor T1 is diode-connected by the third transistor T3 thus turned on, so as to be forward-biased. The first active period AP1 may not overlap the second active period AP2.

The j-th write scan signal SWj is activated in the second active period AP2. The j-th write scan signal SWj has the low level during an active period AP4 (hereinafter referred to as a "fourth active period"). During the fourth active period AP4, the second transistor T2 is turned on by the j-th write scan signal SWj of the low level. In this case, a compensation voltage "Di–Vth" is applied to the third electrode of the first transistor T1. Herein, the compensation voltage "Di–Vth" may correspond to a voltage obtained by subtracting a threshold voltage Vth of the first transistor T1 from a voltage of the i-th data signal Di supplied from the i-th data line DLi. That is, a potential of the third electrode of the first transistor T1 may be the compensation voltage "Di–Vth". The fourth active period AP4 may overlap the second active period AP2. The duration of the second active period AP2 may be longer than the duration of the fourth active period AP4.

The first driving voltage ELVDD and the compensation voltage "Di–Vth" may be respectively applied to opposite ends of the capacitor Cst, and charges corresponding to a voltage difference of the opposite ends of the capacitor Cst may be stored in the capacitor Cst. Herein, a high level period of the j-th compensation scan signal SCj may be referred to as a "compensation period" of the green normal pixel PXG-ij.

Meanwhile, the j-th black scan signal SBj is activated in the second active period AP2 of the j-th compensation scan signal SCj. The j-th black scan signal BSj has the low level during an active period AP3 (hereinafter referred to as a "third active period"). During the third active period AP3, the seventh transistor T7 is turned on by the j-th black scan signal BSj of the low level supplied through the j-th black scan line SBLj. A portion of the driving current Id may be drained through the seventh transistor T7 as a bypass current Ibp. The third active period AP3 may overlap the second active period AP2. The duration of the second active period AP2 may be longer than the duration of the third active period AP3. The third active period AP3 may precede the fourth active period AP4 and may not overlap the fourth active period AP4.

In the case where the green normal pixel PXG-ij displays a black image, the green light emitting element ED_G emits a light due to a minimum driving current flowing to the first transistor T1. That is, the green normal pixel PXG-ij fails to normally display the black image. Accordingly, the seventh transistor T7 of the green normal pixel PXG-ij according to some embodiments of the present disclosure may drain a portion of the minimum driving current of the first transistor T1 to a current path, which is different from a current path to the green light emitting element ED_G, as the bypass current Ibp.

Herein, the minimum driving current of the first transistor T1 means a current flowing to the first transistor T1 under the condition that a gate-source voltage Vgs of the first transistor T1 is smaller than the threshold voltage Vth, that is, the first transistor T1 is turned off. As the minimum driving current (e.g., a current of 10 pA or less) flowing to the first transistor T1 is transferred to the green light emitting element ED_G under the condition that the first transistor T1 is turned off, an image of a black gray scale is displayed. When the green normal pixel PXG-ij displays the black image, the bypass current Ibp has a relatively large influence on the minimum driving current; in contrast, when the green normal pixel PXG-ij displays an image such as a normal image or a white image, there is a little influence of the bypass current Ibp on the driving current Id.

Accordingly, when the green normal pixel PXG-ij displays a black image, a minimum light emitting current, which corresponds to a current obtained by subtracting the bypass current Ibp flowing through the seventh transistor T7 from the minimum driving current, may be provided to the green light emitting element ED_G, and thus, the black image may be clearly displayed. Accordingly, the green normal pixel PXG-ij may implement an accurate black gray image by using the seventh transistor T7, and thus, a contrast ratio may be improved.

Next, the j-th emission control signal EMj that is supplied from the j-th emission control line EMLj transitions from the high level to the low level. The fifth and sixth transistors T5 and T6 are turned on by the j-th emission control signal EMj of the low level. In this case, the driving current Id is generated depending on a difference between the voltage of the third electrode of the first transistor T1 and the first driving voltage ELVDD. The driving current Id thus generated is supplied to the green light emitting element ED_G through the sixth transistor T6, and thus, the driving current Id flows through the green light emitting element ED_G. Accordingly, the green light emitting element ED_G may output a first color light (or first green light) Lg1.

Referring to FIG. 5A to 5C, the hybrid pixel PXs-dj is connected to the i-th data line DLi of the data lines DL1 to DLm, the j-th initialization scan line SILj of the initialization scan lines SIL1 to SILn, the j-th compensation scan line SCLj of the compensation scan lines SCL1 to SCLn, the j-th write scan lines SWLj of the write scan lines SWL1 to SWLn, the j-th black scan line SBLj of the black scan lines SBL1 to SBLn, and the j-th emission control line EMLj of the emission control lines EML1 to EMLn. The hybrid pixel PXs-dj is connected to a d-th readout line RLd among the readout lines RL1 to RLh.

The hybrid pixel PXs-dj may include the hybrid element HD_G and the hybrid circuit HD_C electrically connected to the hybrid element HD_G. The hybrid circuit HD_C includes the pixel circuit unit P_PD and the sensor circuit unit O_SD. The hybrid element HD_G is connected in common to the pixel circuit unit P_PD and the sensor circuit unit O_SD. The pixel circuit unit P_PD may have the same circuit configuration as the green pixel circuit G_PD illustrated in FIG. 5A. Thus, additional description associated with the pixel circuit unit P_PD will be omitted to avoid redundancy.

The sensor circuit unit O_SD is connected to the d-th readout line RLd, the j-th write scan line SWLj, and a reset control line SRL. The sensor circuit unit O_SD includes three transistors ST1 to ST3. The three transistors ST1 to ST3 may be the reset transistor ST1, the amplification transistor ST2, and the output transistor ST3, respectively. At least one of the reset transistor ST1, the amplification transistor ST2, or the output transistor ST3 may be an oxide semiconductor transistor. According to some embodiments of the present disclosure, the reset transistor ST1 may be an oxide semiconductor transistor, and the amplification transistor ST2 and the output transistor ST3 may be LTPS transistors. However, embodiments according to the present disclosure are not limited thereto. For example, at least the reset transistor ST1 and the output transistor ST3 may be oxide semiconductor transistors, and the amplification transistor ST2 may be an LTPS semiconductor transistor.

Also, some of the reset transistor ST1, the amplification transistor ST2, and the output transistor ST3 may be P-type transistors, and the other(s) thereof may be an N-type transistor. According to some embodiments of the present disclosure, the amplification transistor ST2 and the output transistor ST3 may be PMOS transistors, and the reset transistor ST1 may be an NMOS transistor. However, embodiments according to the present disclosure are not limited thereto. For example, all the transistors ST1, ST2, and ST3 may be N-type transistors or P-type transistors.

Some (e.g., the reset transistor ST1) of the reset transistor ST1, the amplification transistor ST2, and the output transistor ST3 may be implemented with a transistor whose type is identical to the type of the third and fourth transistors T3 and T4 of the pixel circuit unit P_PD. The amplification transistor ST2 and the output transistor ST3 may be implemented with a transistor whose type is identical to the type of the first, second, and fifth to seventh transistors T1, T2, and T5 to T7 of the pixel circuit unit P_PD.

The circuit configuration of the sensor circuit unit O_SD according to the present disclosure is not limited to FIG. 5C. The sensor circuit unit O_SD illustrated in FIG. 5C is only one example, and the configuration of the sensor circuit unit O_SD may be modified and carried out. Additionally, although various components are illustrated in FIG. 5C, embodiments according to the present disclosure are not limited thereto, and according to some embodiments, the sensor circuit illustrated in FIG. 5A may include additional components or fewer components without departing from the spirit and scope of embodiments according to the present disclosure.

The reset transistor ST1 includes a first electrode receiving the reset voltage Vrst, a second electrode connected to a first sensing node SN1, and a third electrode receiving a reset control signal SR. The reset transistor ST1 may reset a potential of the first sensing node SN1 with the reset voltage Vrst in response to the reset control signal SR. The reset control signal SR may be a signal that is provided through the reset control line SRL. The reset control signal SR may be a signal that is activated in the light receiving mode and is deactivated in the light emitting mode. According to some embodiments of the present disclosure, the reset voltage Vrst may have a voltage level lower than that of the second driving voltage ELVSS at least during an active period of the reset control signal SR. The reset voltage Vrst may be transferred to the sensor circuit unit O_SD through a reset voltage line VRL. The reset voltage Vrst may be a DC voltage that is maintained at a voltage level lower than that of the second driving voltage ELVSS.

The reset transistor ST1 may include a plurality of sub-reset transistors that are connected in series. For example, the reset transistor ST1 may include two sub-reset transistors (hereinafter referred to as "first and second sub-reset transistors"). In this case, a third electrode of the first sub-reset transistor and a third electrode of the second sub-reset transistor are connected to the reset control line SRL. Also, a second electrode of the first sub-reset transistor and a first electrode of the second sub-reset transistor may be electrically connected. Also, the reset voltage Vrst may be applied to a first electrode of the first sub-reset transistor, and a second electrode of the second sub-reset transistor may be electrically connected to the first sensing node SN1. However, the number of sub-reset transistors is not limited thereto and may be variously changed or modified.

The amplification transistor ST2 includes a first electrode receiving a sensing driving voltage SLVD, a second electrode connected with a second sensing node SN2, and a third electrode connected to the first sensing node SN1. The amplification transistor ST2 may be turned on depending on a potential of the first sensing node SN1 and may apply the sensing driving voltage SLVD to the second sensing node SN2. According to some embodiments of the present disclosure, the sensing driving voltage SLVD may correspond to one of the first driving voltage ELVDD and the first and second initialization voltages Vint and Vaint. When the sensing driving voltage SLVD corresponds to the first driving voltage ELVDD, the first electrode of the amplification transistor ST2 may be electrically connected to the first driving voltage line VL1. When the sensing driving voltage SLVD corresponds to the first initialization voltage Vint, the first electrode of the amplification transistor ST2 may be electrically connected to the first initialization voltage line VIL; when the sensing driving voltage SLVD corresponds to the second initialization voltage Vaint, the first electrode of the amplification transistor ST2 may be electrically connected to the second initialization voltage line VAIL.

The output transistor ST3 includes a first electrode connected to the second sensing node SN2, a second electrode connected to the d-th readout line RLd, and a third electrode receiving an output control signal. The output transistor ST3 may transfer a sensing signal FSd to the d-th readout line RLd in response to the output control signal. The output control signal may be the j-th write scan signal SWj that is supplied through the j-th write scan line SWLj. That is, the output transistor ST3 may receive the j-th write scan signal SWj supplied from the j-th write scan line SWLj as the output control signal.

The hybrid element HD_G includes an anode electrode (or a hybrid anode electrode), a cathode electrode (or a hybrid cathode electrode), and a light emitting stack and a light receiving stack located between the anode electrode and the cathode electrode. The hybrid element HD_G may include a light emitting unit H_ED and a light receiving unit H_OPD. The light emitting unit H_ED is defined by the anode electrode, the light emitting stack, and the cathode electrode, and the light receiving unit H_OPD is defined by the anode electrode, the light receiving stack, and the cathode electrode.

The anode electrode of the hybrid element HD_G is connected in common to the second node N2 of the pixel circuit unit P_PD and the first sensing node SN1 of the sensor circuit unit O_SD. The cathode electrode of the hybrid element HD_G may be connected to the second driving voltage line VL2 transferring the second driving voltage ELVSS. The cathode electrode of the hybrid element HD_G may be electrically connected to the cathode electrode of the green light emitting element ED_G. According to some embodiments of the present disclosure, the cathode electrode of the hybrid element HD_G may be integrally formed with the cathode electrode of the green light emitting element ED_G to form a common cathode electrode.

When the hybrid element HD_G is reverse biased (i.e., in the light emitting mode), the hybrid element HD_G outputs a second color light (or second green light) Lg2 through the light emitting unit H_ED turned on in the reverse bias state. When the hybrid element HD_G is forward biased (i.e., in the light receiving mode), the hybrid element HD_G and may receive the first color light (or first green light) Lg1 through the light receiving unit H_OPD turned on in the forward bias state.

In the light emitting mode, the green light emitting element ED_G may output the first color light, and the hybrid element HD_G may output the second color light. In the light receiving mode, the green light emitting element ED_G may output the first color light, and the hybrid element HD_G may be exposed to the first color light output from the green light emitting element ED_G. When the user's hand US_F (refer to FIG. 1) touches the display surface IS (refer to FIG. 1), the light receiving unit H_OPD of the hybrid element HD_G generates photoelectrons corresponding to the light reflected by a ridge of a fingerprint or a valley between ridges. The amount of current flowing the light receiving unit H_OPD changes depending on the generated photoelectrons.

A current flowing through the light receiving unit H_OPD when the light receiving unit H_OPD receives the light reflected by the ridge of the fingerprint may be referred to as a "first current", and a current flowing through the light receiving unit H_OPD when the light receiving unit H_OPD receives the light reflected by the valley of the fingerprint may be referred to as a "second current". Because a difference exists between the amount of light reflected by the ridge of the fingerprint and the amount of light reflected by the valley of the fingerprint, the difference appears as a difference between the first and second currents. A potential of the first sensing node SN1 formed when the first current flows through the light receiving unit H_OPD may be referred to as a "first potential", and a potential of the first sensing node SN1 formed when the second current flows through the light receiving unit H_OPD may be referred to as a "second current". As an example of the present disclosure, the first current may be greater than the second current; in this case, the first potential may be lower than the second potential.

The amplification transistor ST2 may be a source follower amplifier that generates a source-drain current in proportion to the potential of the first sensing node SN1 input to the third electrode of the amplification transistor ST2.

During the fourth active period AP4, the j-th write scan signal SWj of the low level is supplied to the output transistor ST3 through the j-th write scan line SWLj. When the output transistor ST3 is turned on in response to the j-th write scan signal SWj of the low level, the sensing signal FSd corresponding to a current flowing through the amplification transistor ST2 may be output to the d-th readout line RLd.

Next, when the reset control signal SR of the high level is supplied through the reset control line SRL during a reset period, the reset transistor ST1 is turned on. The reset period may be defined as an active period (i.e., high level period) of the reset control signal SR. Alternatively, when the reset transistor ST1 is implemented with a P-type transistor, during the reset period, the reset control signal SR of the low level may be supplied to the reset control line SRL. During the reset period, the first sensing node SN1 may be reset with a potential corresponding to the reset voltage Vrst. As an example of the present disclosure, a voltage level of the reset voltage Vrst may be lower than that of the second driving voltage ELVSS.

Then, when the reset period ends, the light receiving unit H_OPD may generate photoelectrons corresponding to the received light, and the generated photoelectrons may again be accumulated at the first sensing node SN1.

Figure 6:
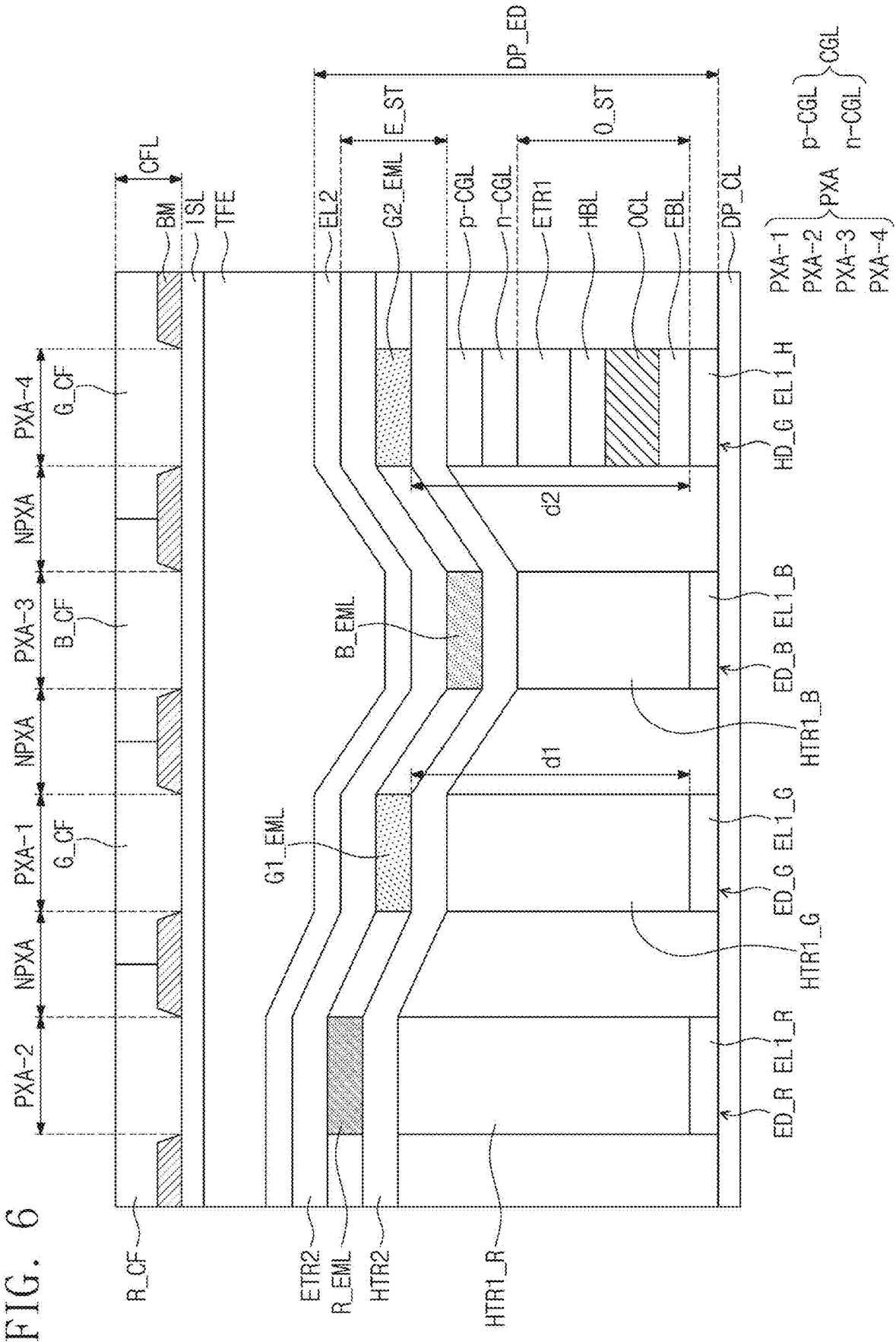
FIG. 6 is a cross-sectional view illustrating green, read, and blue normal pixels and a hybrid pixel according to some embodiments of the present disclosure.

FIG. 6 is a cross-sectional view illustrating green, read, and blue normal pixels and a hybrid pixel according to some embodiments of the present disclosure.

Referring to FIGS. 2 and 6, the display panel DP includes the base layer BL, the circuit layer DP_CL, the element layer DP_ED, and the encapsulation layer TFE. The element layer DP_ED is located on the circuit layer DP_CL. The element layer DP_ED may include the plurality of light emitting elements ED_G, ED_R, and ED_B and the hybrid element HD_G. The plurality of light emitting elements ED_G, ED_R, and ED_B may include the green light emitting element ED_G, the red light emitting element ED_R, and the blue light emitting element ED_B.

The display area DA (refer to FIG. 3) of the display panel DP may include a plurality of pixel areas PXA and a non-pixel area NPXA surrounding the plurality of pixel areas PXA. The plurality of pixel areas PXA may include a first pixel area PXA-1, a second pixel area PXA-2, and a third pixel area PXA-3. The first pixel area PXA-1, the second pixel area PXA-2, and the third pixel area PXA-3 may respectively emit lights of different wavelengths. The first pixel area PXA-1 is an area where the green light emitting element ED_G is located and outputs the first green light having a green wavelength. The second pixel area PXA-2 is an area where the red light emitting element ED_R is located and outputs a red light having a red wavelength. The third pixel area PXA-3 is an area where the blue light emitting element ED_B is located and outputs a blue light having a blue wavelength.

The plurality of pixel areas PXA may further include a hybrid pixel area PXA-4. The hybrid pixel area PXA-4 is an area where the hybrid element HD_G is located. Accordingly, the hybrid pixel area PXA-4 (hereinafter referred to as a "fourth pixel area PXA-4) may output the second color light having the green wavelength in the light emitting mode (or a display mode) and may sense the first color light output from the first pixel area PXA-1 in the light receiving mode (or a sensing mode).

The non-pixel area NPXA may be an area defined between the pixel areas PXA adjacent to each other and may be an area where the light emitting elements ED_G, ED_R, and ED_B and the hybrid element HD_G are not substantially located.

The green light emitting element ED_G is arranged to overlap the first pixel area PXA-1. The green light emitting element ED_G includes an anode electrode (or a green anode electrode) EL1_G, a green light emitting layer (or a first light emitting layer) G1_EML located on the green anode electrode EL1_G, and a cathode electrode (or a common cathode electrode) EL2 located on the green light emitting layer G1_EML. The green light emitting element ED_G further includes a green hole transport layer HTR1_G located between the green anode electrode EL1_G and the green light emitting layer G1_EML and a common hole transport layer HTR2 located on the green hole transport layer HTR1_G. The green light emitting element ED_G further include a common electron transport layer ETR2 located between the green light emitting layer G1_EML and the cathode electrode EL2.

The red light emitting element ED_R is arranged to overlap the second pixel area PXA-2. The red light emitting element ED_R includes an anode electrode (or a red anode electrode) EL1_R, a red light emitting layer R_EML located on the red anode electrode EL1_R, and the cathode electrode (or the common cathode electrode) EL2 located on the red light emitting layer R_EML. The red light emitting element ED_R further includes a red hole transport layer HTR1_R located between the red anode electrode EL1_R and the red light emitting layer R_EML and the common hole transport layer HTR2 located on the red hole transport layer HTR1_R. The red light emitting element ED_R further include the common electron transport layer ETR2 located between the red light emitting layer R_EML and the cathode electrode EL2.

The blue light emitting element ED_B is arranged to overlap the third pixel area PXA-3. The blue light emitting element ED_B includes an anode electrode (or a blue anode electrode) EL1_B, a blue light emitting layer B_EML located on the blue anode electrode EL1_B, and the cathode electrode (or the common cathode electrode) EL2 located on the blue light emitting layer B_EML. The blue light emitting element ED_B further includes a blue hole transport layer HTR1_B located between the blue anode electrode EL1_B and the blue light emitting layer B_EML and the common hole transport layer HTR2 located on the blue hole transport layer HTR1_B. The blue light emitting element ED_B further includes the common electron transport layer ETR2 located between the blue light emitting layer B_EML and the cathode electrode EL2.

The green, red, and blue anode electrodes EL1_G, EL1_R, and EL1_B may be formed of a metal material, a metal alloy, or a conductive compound. The green, red, and blue anode electrodes EL1_G, EL1_R, and EL1_B may be a transparent electrode, a semi-transparent electrode, or a reflective electrode.

The green, red, and blue hole transport layers HTR1_G, HTR1_R, and HTR1_B may be formed by using various methods such as a vacuum deposition method, a spin coating method, a cast method, an LB (Langmuir-Blodget) method, an inkjet printing method, a laser printing method, and an LITI (Laser Induced Thermal Imaging) method. The green, red, and blue hole transport layers HTR1_G, HTR1_R, and HTR1_B may be patterned and provided in the first to third pixel areas PXA-1, PXA-2, and PXA-3, respectively, and may not overlap the non-pixel area NPXA. Also, the green, red, and blue hole transport layers HTR1_G, HTR1_R, and HTR1_B may have different thicknesses. As the green, red, and blue hole transport layers HTR1_G, HTR1_R, and HTR1_B have different thicknesses, a resonance distance according to a wavelength of a light emitted from each of the green, red, and blue light emitting elements ED_G, ED_R, and ED_B may be compensated for, and thus, the light emitting efficiency of each of the green, red, and blue light emitting elements ED_G, ED_R, and ED_B may increase. However, the present disclosure is not limited thereto. The green, red, and blue hole transport layers HTR1_G, HTR1_R, and HTR1_B may have the same thickness. In this case, the green, red, and blue hole transport layers HTR1_G, HTR1_R, and HTR1_B may be provided as a common layer so as to overlap both the first, second, and third pixel areas PXA-1, PXA-2, and PXA-3 and the non-pixel area N PXA.

The green, red, and blue light emitting layers G1_EML, R_EML, and B_EML may respectively overlap the first to third pixel areas PXA-1, PXA-2, and PXA-3. The green, red, and blue light emitting layers G1_EML, R_EML, and B_EML may be spaced apart from each other in a plan view. The green, red, and blue light emitting layers G1_EML, R_EML, and B_EML may emit lights belonging to different wavelength ranges. That is, the green, red, and blue light emitting layers G1_EML, R_EML, and B_EML may respectively emit the first green light, the red light, and the blue light.

Each of the common hole transport layer HTR2 and the common electron transport layer ETR2 may be provided in the shape of a common layer so as to overlap both the first to third pixel areas PXA-1, PXA-2, and PXA-3 and the non-pixel area NPXA.

The hybrid element HD_G is arranged to overlap the fourth pixel area PXA-4. The hybrid element HD_G includes an anode electrode (or a hybrid anode electrode) EL1_H, a light receiving stack O_ST stacked on the hybrid anode electrode EL1_H, a light emitting stack E_ST located on the light receiving stack O_ST, and the cathode electrode (or a hybrid cathode electrode or a common cathode electrode) EL2 located on the light emitting stack E_ST. The hybrid anode electrode EL1_H may include the same material as the green, red, and blue anode electrodes EL1_G, EL1_R, and EL1_B.

According to some embodiments of the present disclosure, the light receiving stack O_ST may include an electron blocking layer EBL, a photoelectric conversion layer OCL, a hole blocking layer HBL, and an electron transport layer ETR1. The electron blocking layer EBL is located on the hybrid anode electrode EL1_H, and the photoelectric conversion layer OCL is located on the electron blocking layer EBL. The hole blocking layer HBL is located on the photoelectric conversion layer OCL. The photoelectric conversion layer OCL that is a layer of converting an incident light into an electrical signal may generate electrons and holes based on the light so as to be transferred to the hybrid anode electrode EL1_H or the cathode electrode EL2.

The electron blocking layer EBL may block electrons transferred from the light emitting stack E_ST. The hole blocking layer HBL blocks holes introduced into the light receiving stack O_ST from moving to the light emitting stack E_ST. The electron transport layer ETR1 transports electrons provided from the light emitting stack E_ST to the photoelectric conversion layer OCL. The electron blocking layer EBL, the photoelectric conversion layer OCL, the hole blocking layer HBL, and the electron transport layer ETR1 of the light receiving stack O_ST may be provided only in the fourth pixel area PXA-4. That is, the electron blocking layer EBL, the photoelectric conversion layer OCL, the hole blocking layer HBL, and the electron transport layer ETR1 may overlap the fourth pixel area PXA-4 and may not overlap the first to third pixel areas PXA-1, PXA-2, and PXA-3 and the non-pixel area NPXA.

According to some embodiments of the present disclosure, the light emitting stack E_ST includes the common hole transport layer HTR2, a light emitting layer (or second light emitting layer) G2_EML located on the common hole transport layer HTR2, and the common electron transport layer ETR2. The light emitting layer G2_EML may overlap the fourth pixel area PXA-4. The light emitting layer G2_EML may emit the second green light being a light belonging to the same wavelength range as the green light emitting layer G1_EML. The light emitting layer G2_EML may be spaced from the green, red, and blue light emitting layers G1_EML, R_EML, and B_EML in a plan view.

Each of the common hole transport layer HTR2 and the common electron transport layer ETR2 may be provided in the shape of a common layer so as to overlap both the first to fourth pixel areas PXA-1, PXA-2, PXA-3, and PXA-4 and the non-pixel area NPXA.

The hybrid element HD_G may further include a charge generating layer CGL located between the light receiving stack O_ST and the light emitting stack E_ST. When a voltage is applied, the charge generating layer CGL may generate charges (i.e., electrons and holes) by forming a complex through an oxidation-reduction reaction. The charge generating layer CGL may provide the generated charges to the light receiving stack O_ST or the light emitting stack E_ST. The charge generating layer CGL may double the efficiency of a current generated in the light receiving stack O_ST or the light emitting stack E_ST and may adjust the balance of charges in the light receiving stack O_ST or the light emitting stack E_ST.

The charge generating layer CGL may include an n-type charge generation layer n-CGL and a p-type charge generation layer p-CGL. According to some embodiments, the n-type charge generation layer n-CGL may be located adjacent to the light receiving stack O_ST, and the p-type charge generation layer p-CGL may be located adjacent to the light emitting stack E_ST.

The n-type charge generation layer N-CGL may be a charge generation layer that generates electrons. The n-type charge generation layer n-CGL may be a layer in which a base material is doped with an n-type dopant. The p-type charge generation layer p-CGL may be a charge generation layer that generates holes. The p-type charge generation layer p-CGL may be a layer in which a base material is doped with a p-type dopant. A buffer layer may be further located between the n-type charge generation layer n-CGL and the p-type charge generation layer p-CGL.

The charge generating layer CGL may include an n-type aryl amine-based material or p-type metal oxide. For example, the charge generating layer CGL may include a charge generating compound made of an aryl amine-based organic compound, metal, metal oxide, carbide, fluoride, or a mixture thereof.

The n-type charge generation layer n-CGL may overlap the fourth pixel area PXA-4 and may be located on the electron transport layer ETR1. The p-type charge generation layer p-CGL may overlap the fourth pixel area PXA-4 and may be located on the n-type charge generation layer n-CGL. The light emitting stack E_ST may be located on the p-type charge generation layer p-CGL.

As an example of the present disclosure, a distance d1 between the green anode electrode EL1_G and the green light emitting layer G1_EML may be substantially equal to a distance d2 between the hybrid anode electrode EL1_H and the light emitting layer G2_EML. Accordingly, the resonance distance of the first color light Lg1 emitted from the green light emitting element ED_G may be equal to the resonance distance of the second color light Lg2 emitted from the hybrid element HD_G. This may mean that the hybrid element HD_G has the same light emitting efficiency as the green light emitting element ED_G.

The encapsulation layer TFE is located on the element layer DP_ED. The encapsulation layer TFE includes at least one inorganic layer or at least one organic layer. According to some embodiments of the present disclosure, the encapsulation layer TFE may include two inorganic layers and an organic layer interposed therebetween. According to some embodiments of the present disclosure, the encapsulation layer TFE may include a plurality of inorganic layers and a plurality of organic layers that are alternately stacked.

The inorganic layer protects the green, red, and blue light emitting elements ED_G, ED_R, and ED_B and the hybrid element HD_G from moisture/oxygen, and the organic layer protects the green, red, and blue light emitting elements ED_G, ED_R, and ED_B and the hybrid element HD_G from foreign substances such as dust particles. The inorganic layer may include a silicon nitride layer, a silicon oxynitride layer, a silicon oxide layer, a titanium oxide layer, an aluminum oxide layer, etc. but is not particularly limited thereto. The organic layer may include an acrylic-based organic layer but is not particularly limited thereto.

The display device DD (refer to FIG. 2) includes the input sensing layer ISL located on the display panel DP (refer to FIG. 2) and the color filter layer CFL located on the input sensing layer ISL. The input sensing layer ISL may be directly located on the encapsulation layer TFE. A structure in which the input sensing layer ISL is directly located on the encapsulation layer TFE is illustrated in FIG. 6, but the present disclosure is not limited thereto.

The color filter layer CFL may be located on the input sensing layer ISL. The color filter layer CFL may include a first color filter G_CF, a second color filter R_CF, and a third color filter B_CF. The first color filter G_CF has a first color, the second color filter R_CF has a second color, and the third color filter B_CF has a third color. As an example of the present disclosure, the first color may be a green, the second color may be a red, and the third color may be a blue. The first color filter G_CF is arranged to overlap the first and fourth pixel areas PXA-1 and PXA-4, and the second and third color filters R_CF and B_CF are arranged to overlap the second and third pixel areas PXA-2 and PXA-3.

The color filter layer CFL may further include a black matrix BM. The black matrix BM may be arranged to correspond to the non-pixel area NPXA. The black matrix BM may not overlap the first to fourth pixel areas PXA-1, PXR-2, PXA-3, and PXA-4.

Figure 7A:
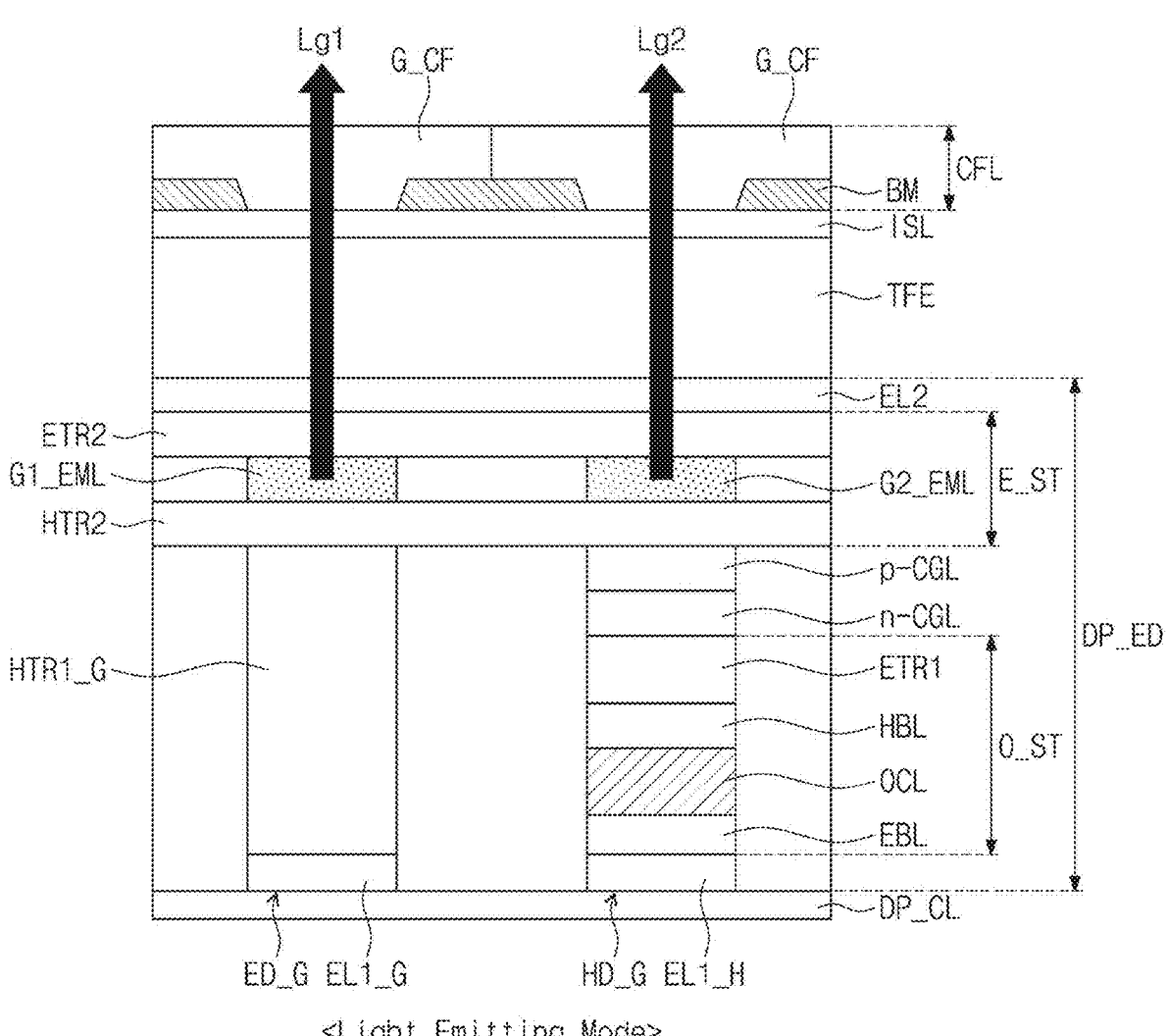
FIG. 7A is a diagram illustrating the case where a display panel according to some embodiments of the present disclosure operates in a light emitting mode.
Figure 7B:
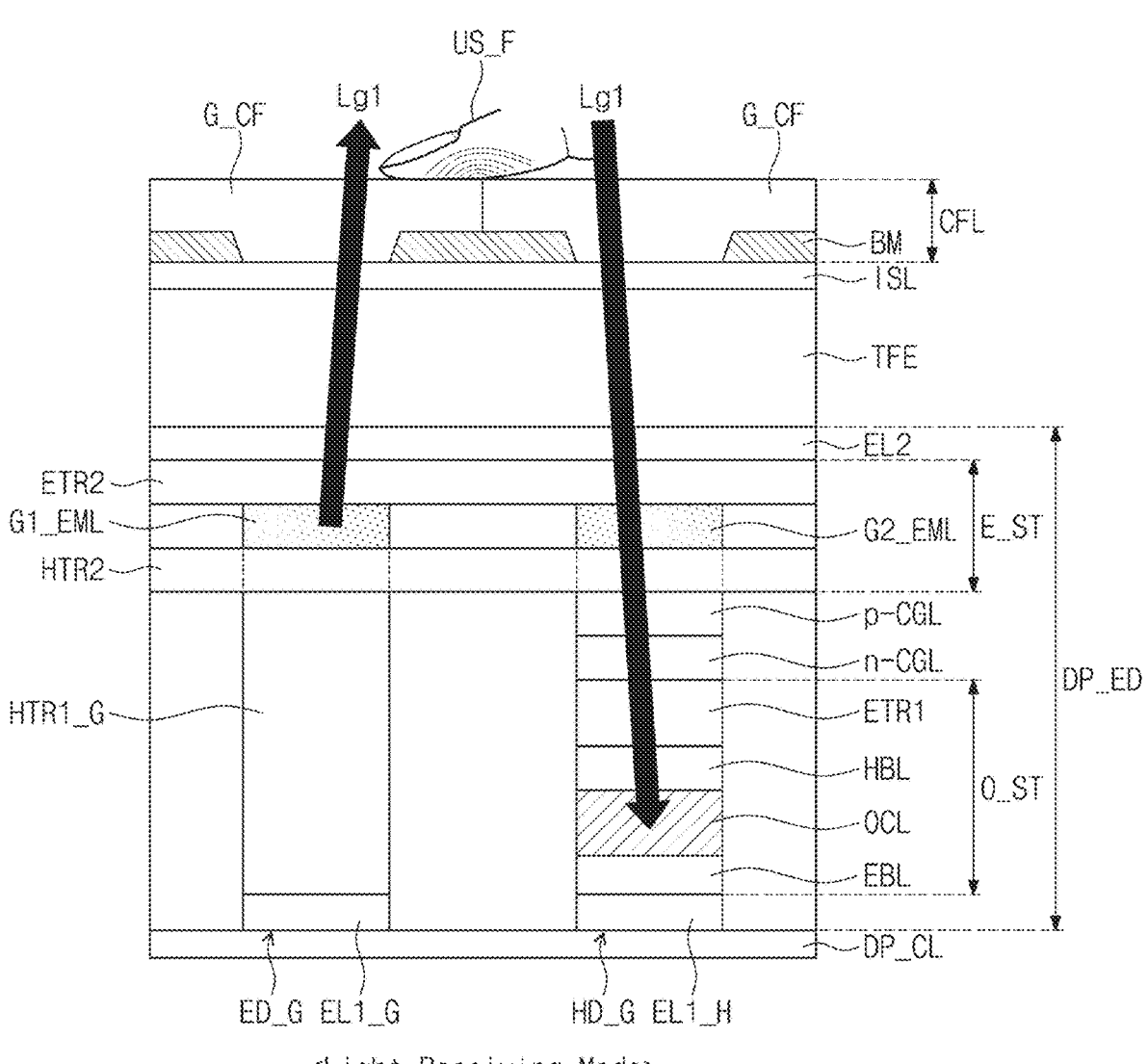
FIG. 7B is a diagram illustrating the case where a display panel according to some embodiments of the present disclosure operates in a light receiving mode.
Figure 8A:
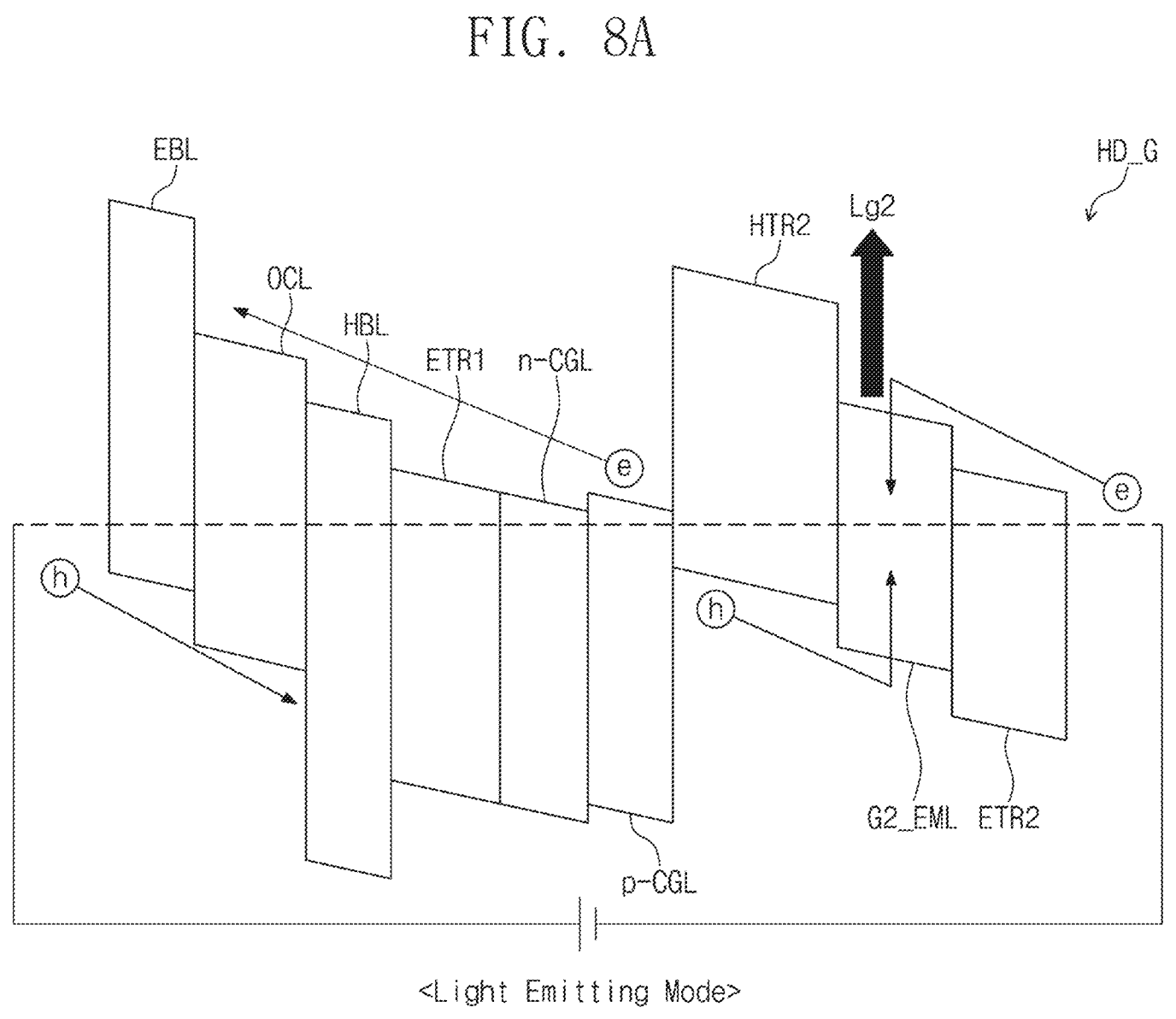
Figure 8B:
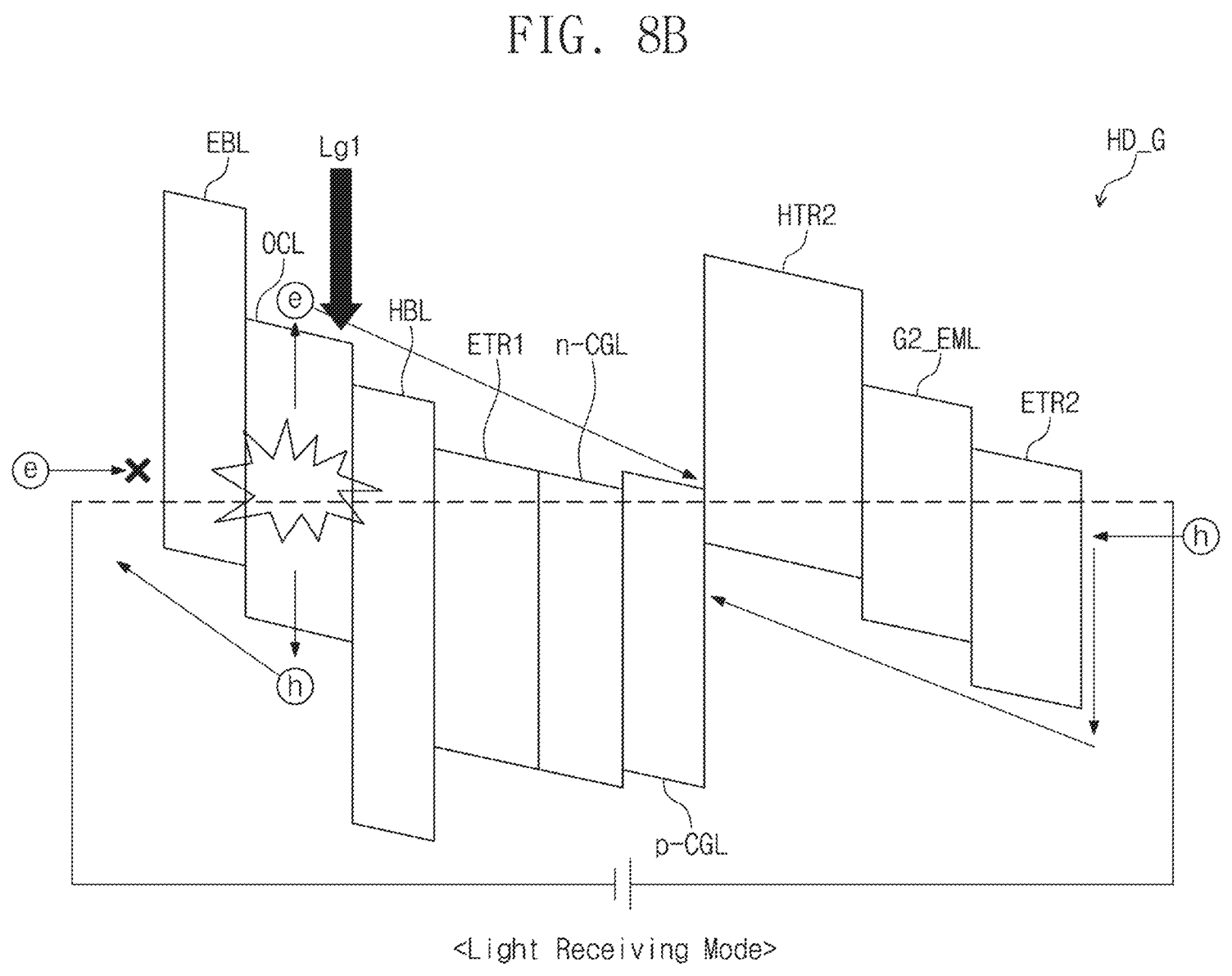

FIG. 7A is a diagram illustrating the case where a display panel according to some embodiments of the present disclosure operates in a light emitting mode, and FIG. 7B is a diagram illustrating the case where a display panel according to some embodiments of the present disclosure operates in a light receiving mode. FIG. 8A is a conceptual diagram illustrating the case where a hybrid pixel according to some embodiments of the present disclosure operates in a light emitting mode, and FIG. 8B is a conceptual diagram illustrating the case where a hybrid pixel according to some embodiments of the present disclosure operates in a light receiving mode.

Referring to FIGS. 7A and 8A, in the light emitting mode, the green light emitting element ED_G may output the first color light (or a first green light) Lg1, and the hybrid element HD_G may output the second color light (or a second green light) Lg2. The hybrid element HD_G may output the second color light (or the second green light) Lg2 through the light emitting stack E_ST.

In the light emitting mode, when the reverse bias is applied between the hybrid anode electrode EL1_H and the cathode electrode EL2 of the hybrid element HD_G, the hole $\textcircled{h}$ may move from the common hole transport layer HTR2 to the light emitting layer G2_EML, and the electron $\textcircled{e}$ may move from the common electron transport layer ETR2 to the light emitting layer G2_EML. As such, an exciton may be formed in the light emitting stack E_ST through the combination of the hole $\textcircled{h}$ and the electron $\textcircled{e}$. That is, a light may be emitted.

In the light emitting mode, the hole $\textcircled{h}$ introduced into the light receiving stack O_ST may be blocked by the hole blocking layer HBL so as not to be provided to the light emitting stack E_ST. Also, in the light emitting mode, the electron $\textcircled{e}$ from the light emitting stack E_ST may be blocked by the electron blocking layer EBL. Accordingly, in the light emitting mode, the light receiving stack O_ST may not operate and may be maintained in a turn-off state.

Referring to FIGS. 7B and 8B, in the light receiving mode, the green light emitting element ED_G may output the first color light (or the first green light) Lg1, and the hybrid element HD_G may receive the first color light (or the first green light) Lg1. The hybrid element HD_G may receive the first color light (or the first green light) Lg1 through the light receiving stack O_ST.

In the light receiving mode, the first color light (or the first green light) Lg1 output from the green light emitting element ED_G may be reflected by the user's hand US_F and may be provided to the hybrid element HD_G. In this case, when the forward bias is applied between the hybrid anode electrode EL1_H and the cathode electrode EL2 of the hybrid element HD_G, the photoelectric conversion layer OCL generates the electron $\textcircled{e}$ and the hole $\textcircled{h}$ based on the first color light (or first green light) Lg1. The hole $\textcircled{h}$ generated from the photoelectric conversion layer OCL may move to the hybrid anode electrode EL1_H, and the electron $\textcircled{e}$ generated from the photoelectric conversion layer OCL may move to the cathode electrode EL2. A potential of the first sensing node SN1 (refer to FIG. 5C) of the sensor circuit unit O_SD (refer to FIG. 5C) may be varied by the movement of the hole $\textcircled{h}$ and the electron $\textcircled{e}$ generated in the light receiving stack O_ST. In the light receiving mode, the readout circuit 500 (refer to FIG. 3) may detect the potential change of the first sensing node SN1 to sense the user's fingerprint.

In the light receiving mode, the hole $\textcircled{h}$ introduced into the light emitting stack E_ST may be blocked by the common electron transport layer ETR2 so as not to be provided to the light emitting layer G2_EML. A hole blocking area may be included in the common electron transport layer ETR2. Also, in the light receiving mode, the electron $\textcircled{e}$ may be blocked by the electron blocking layer EBL so as not to be provided to the photoelectric conversion layer OCL. Accordingly, in the light receiving mode, the light emitting stack E_ST may not operate and may be maintained in a turn-off state.

The electron blocking layer EBL may have an LUMO energy level higher than that of the photoelectric conversion layer OCL. As an example of the present disclosure, an LUMO energy level difference of the electron blocking layer EBL and the photoelectric conversion layer OCL may be about 3.0 eV or more. The hole blocking layer HBL may have an HUMO energy level lower than that of the photoelectric conversion layer OCL. As an example of the present disclosure, an HUMO energy level difference of the hole blocking layer HBL and the photoelectric conversion layer OCL may be about −3.0 eV or more. Accordingly, the energy bandgap of the photoelectric conversion layer OCL may be secured as much as about 3.0 eV or more. In the specification, the LUMO energy level is an energy level of the lowest unoccupied molecular orbital, and the HOMO energy level is an energy level of the highest occupied molecular orbital.

In each reference pixel unit RPU, one of light emitting elements outputting the same color light is replaced with a hybrid element with a light emitting function and a light receiving function, and thus, there is no need to add a separate light receiving element for recognizing only biometric information to the display panel DP, except for light emitting elements. Accordingly, the display device DD may recognize biometric information without the decrease in the overall resolution of the display panel DP.

Figure 9:
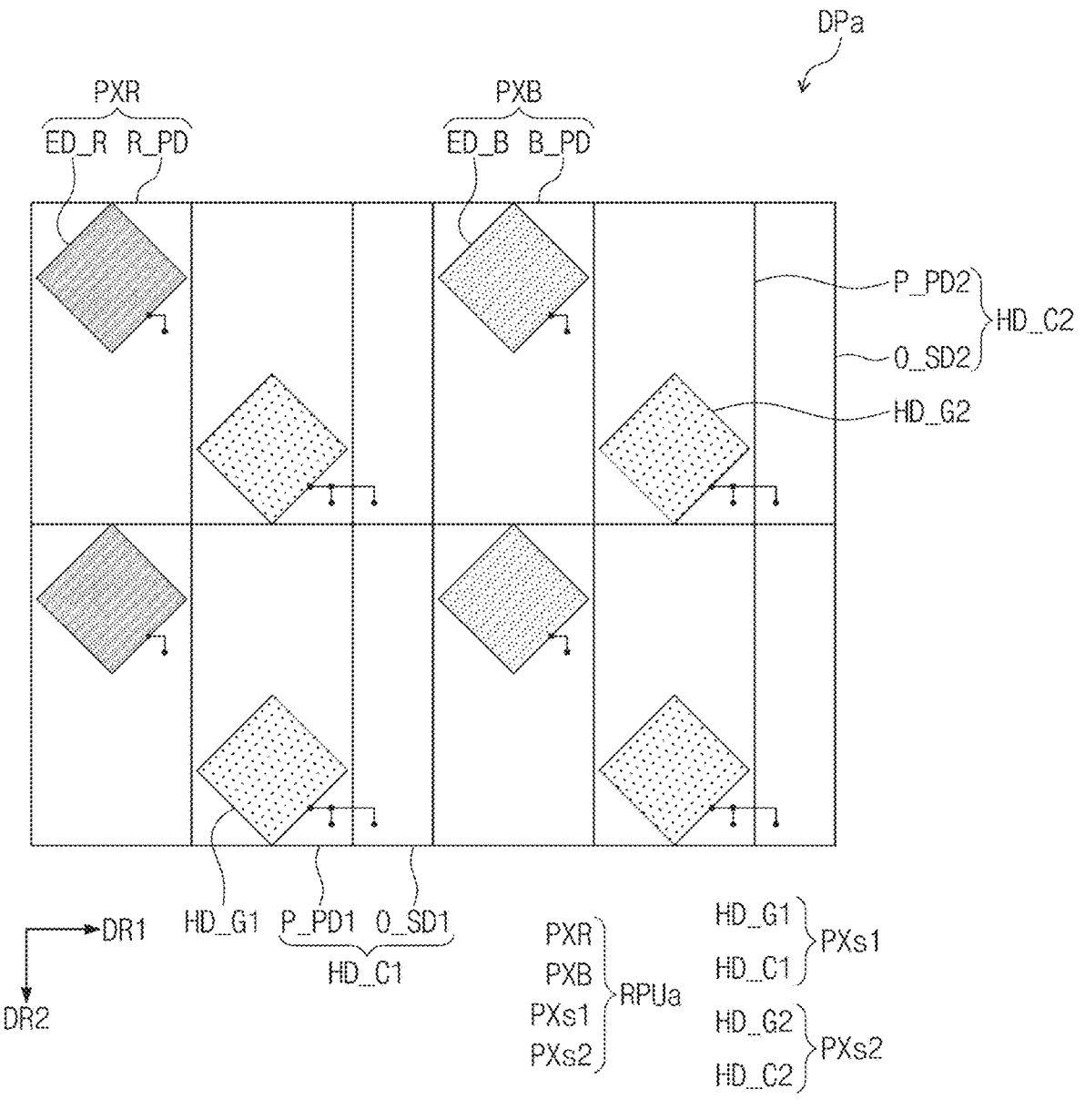
FIG. 9 is an enlarged plan view of a partial area of a display panel according to some embodiments of the present disclosure.
Figure 10A:
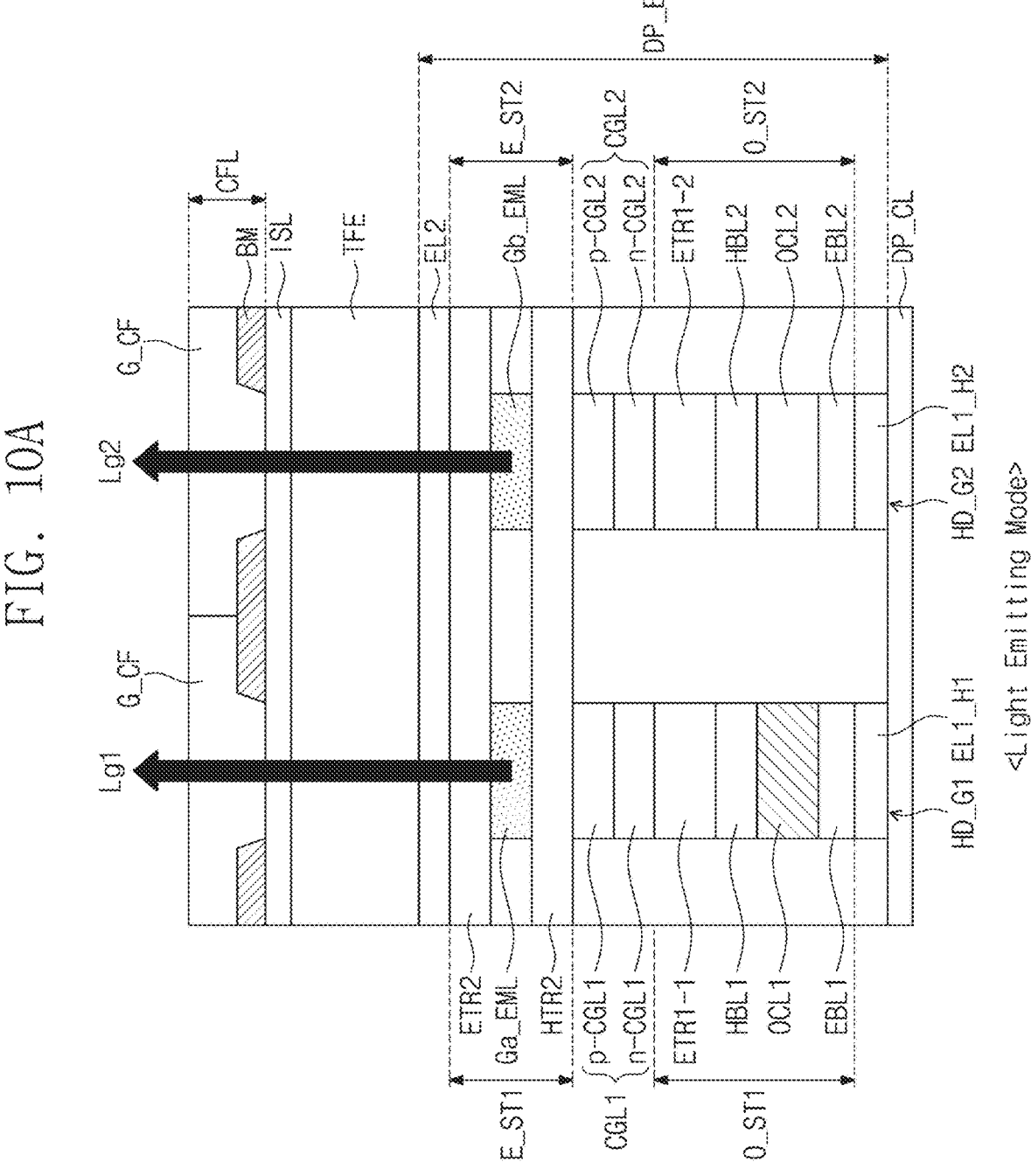
FIG. 10A is a diagram illustrating the case where a display panel according to some embodiments of the present disclosure operates in a light emitting mode.
Figure 10B:
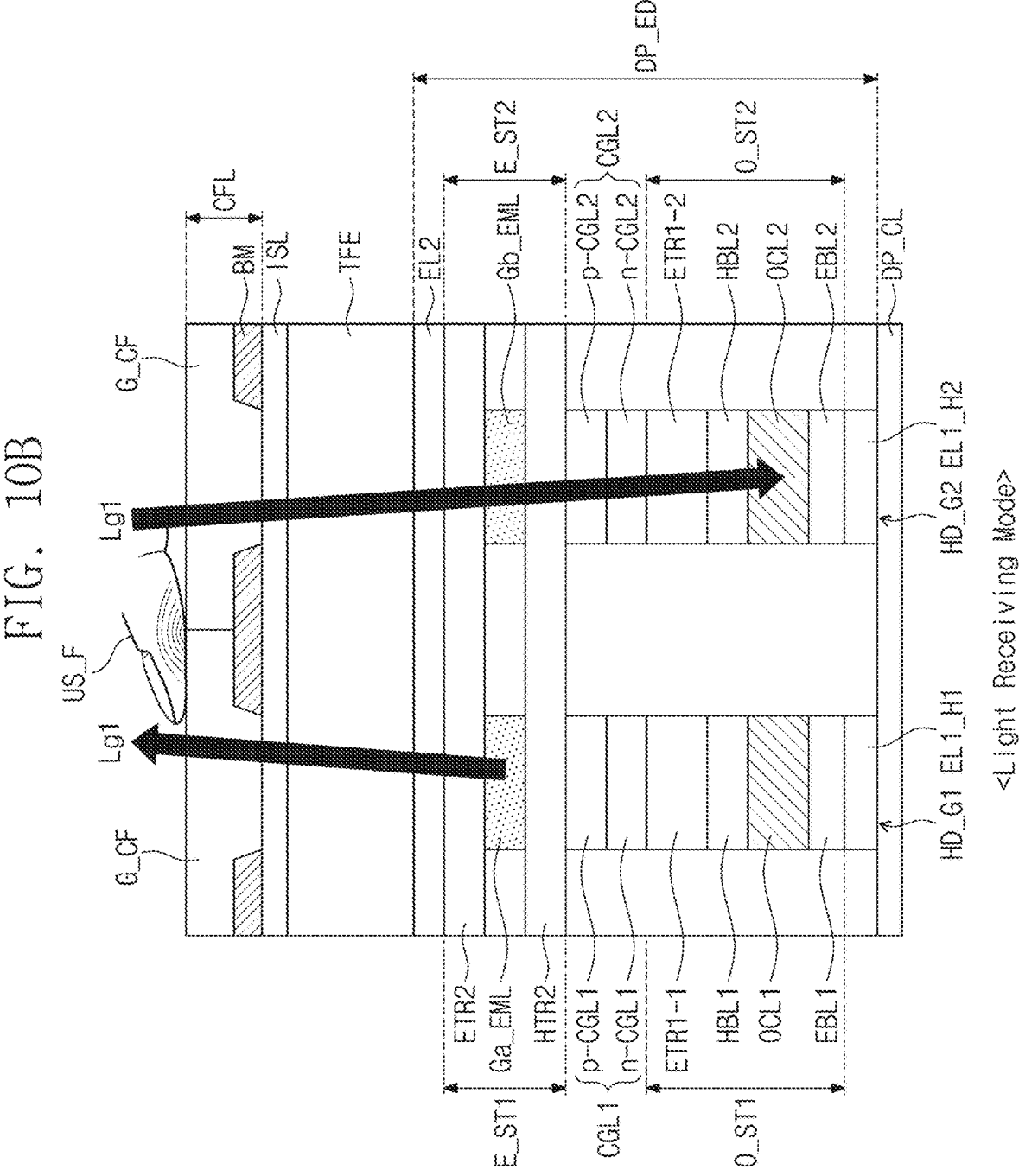
FIG. 10B is a diagram illustrating the case where a display panel according to some embodiments of the present disclosure operates in a light receiving mode.

FIG. 9 is an enlarged plan view of a partial area of a display panel according to some embodiments of the present disclosure. FIG. 10A is a diagram illustrating the case where a display panel according to some embodiments of the present disclosure operates in a light emitting mode, and FIG. 10B is a diagram illustrating the case where a display panel according to some embodiments of the present disclosure operates in a light receiving mode. Components, which are the same as the components illustrated in FIGS. 4, 7A, and 7B, from among components illustrated in FIGS. 9, 10A, and 10B are marked by the same reference numerals/signs, and thus, additional description will be omitted to avoid redundancy.

Referring to FIG. 9, a display panel DPa includes a plurality of normal pixels PXR and PXB, a plurality of first hybrid pixels PXs1, and a plurality of second hybrid pixels PXs2.

The plurality of normal pixels PXR and PXB and the plurality of first hybrid pixels PXs1, and the plurality of second hybrid pixels PXs2 may be grouped into a plurality of reference pixel units RPUa. According to some embodiments of the present disclosure, each reference pixel unit RPUa may include two normal pixels PXR and PXB and two hybrid pixel PXs1 and PXs2. Two normal pixels PXR and PXB may include the red normal pixel RXR and the blue normal pixel PXB. However, the number of normal pixels PXR and PXB included in each reference pixel unit RPUa is not limited thereto.

The red normal pixel RXR include the red light emitting element ED_R, and the blue normal pixel PXB includes the blue light emitting element ED_B. The first hybrid pixel PXs1 includes a first hybrid element HD_G1, and the second hybrid pixel PXs2 includes a second hybrid element HD_G2. As an example of the present disclosure, the first hybrid element HD_G1 may output the first color light (or the first green light) Lg1 in the light emitting mode and the light receiving mode, and the second hybrid element HD_G2 may output the second color light (or the second green light) Lg2 in the light emitting mode and may receive the first color light Lg1 in the light receiving mode. Alternatively, the second hybrid element HD_G2 may output the second color light (or the second green light) Lg2 in the light emitting mode and the light receiving mode, and the first hybrid element HD_G1 may output the first color light (or the first green light) Lg1 in the light emitting mode and may receive the second color light Lg2 in the light receiving mode.

The red light emitting elements ED_R and the blue light emitting elements ED_B may be arranged repeatedly and alternately on the first direction DR1. The first and second hybrid elements HD_G1 and HD_G2 may be arranged repeatedly and alternately on the first direction DR1.

The first and second hybrid elements HD_G1 and HD_G2 may have the same shape or may have different shapes. For example, the first and second hybrid elements HD_G1 and HD_G2 may have the same size (or area) but may have different shapes. Also, the first and second hybrid elements HD_G1 and HD_G2 may be different sizes (or areas) but may have the same shape.

The first hybrid element HD_G1 is electrically connected to a first hybrid circuit HD_C1, and the second hybrid element HD_G2 is electrically connected to a second hybrid circuit HD_C2. The first hybrid circuit HD_C1 includes a first pixel circuit unit P_PD1 and a first sensor circuit unit O_SD1. The second hybrid element HD_G2 is connected in common to a second pixel circuit unit P_PD2 and a second sensor circuit unit O_SD2.

The first pixel circuit unit P_PD1 and the first sensor circuit unit O_SD1 may be adjacent to each other on the first direction DR1. According to some embodiments of the present disclosure, the first pixel circuit unit P_PD1 may be located between the red pixel circuit R_PD and the first sensor circuit unit O_SD1. The second pixel circuit unit P_PD2 and the second sensor circuit unit O_SD2 may be adjacent to each other on the first direction DR1. According to some embodiments of the present disclosure, the second pixel circuit unit P_PD2 may be located between the blue pixel circuit B_PD and the second sensor circuit unit O_SD2.

Referring to FIGS. 10A and 10B, the first hybrid element HD_G1 includes an anode electrode (or a first hybrid anode electrode) EL1_H1, a first light receiving stack O_ST1 located on the first hybrid anode electrode EL1_H1, a first light emitting stack E_ST1 located on the first light receiving stack O_ST1, and the cathode electrode (or a common cathode electrode) EL2 located on the first light emitting stack E_ST1. The second hybrid element HD_G2 includes an anode electrode (or a second hybrid anode electrode) EL1_H2, a second light receiving stack O_ST2 located on the second hybrid anode electrode EL1_H2, a second light emitting stack E_ST2 located on the second light receiving stack O_ST2, and the cathode electrode (or the common cathode electrode) EL2 located on the second light emitting stack E_ST2.

The first and second hybrid anode electrodes EL1_H1 and EL1_H2 may include the same material as the red and blue anode electrodes EL1_R and EL1_B (refer to FIG. 6).

As an example of the present disclosure, the first light receiving stack O_ST1 may include a first electron blocking layer EBL1, a first photoelectric conversion layer OCL1, a first hole blocking layer HBL1, and a first electron transport layer ETR1-1. The first electron blocking layer EBL1 is located on the first hybrid anode electrode EL1_H1, and the first photoelectric conversion layer OCL1 is located on the first electron blocking layer EBL1. The first hole blocking layer HBL1 is located on the first photoelectric conversion layer OCL1.

The first light emitting stack E_ST1 includes the common hole transport layer HTR2, a first light emitting layer Ga_EML located on the common hole transport layer HTR2, and the common electron transport layer ETR2. The first light emitting layer Ga_EML may emit the first green light being a light belonging to a green wavelength range. The first light emitting layer Ga_EML may be spaced from the red and blue light emitting layers R_EML and B_EML in a plan view.

The first hybrid element HD_G1 may further include a first charge generating layer CGL1 located between the first light receiving stack O_ST1 and the first light emitting stack E_ST1. The first charge generating layer CGL1 may include a layer structure in which a first n-type charge generation layer n-CGL1 and a first p-type charge generation layer p-CGL1 are joined. According to some embodiments, the first n-type charge generation layer n-CGL1 may be located adjacent to the first light receiving stack O_ST1, and the first p-type charge generation layer p-CGL1 may be located adjacent to the first light emitting stack E_ST1.

As an example of the present disclosure, the second light receiving stack O_ST2 may include a second electron blocking layer EBL2, a second photoelectric conversion layer OCL2, a second hole blocking layer HBL2, and a second electron transport layer ETR1-2. The second electron blocking layer EBL2 is located on the second hybrid anode electrode EL1_H2, and the second photoelectric conversion layer OCL2 is located on the second electron blocking layer EBL2. The second hole blocking layer HBL2 is located on the second photoelectric conversion layer OCL2.

The second light emitting stack E_ST2 includes the common hole transport layer HTR2, a second light emitting layer Gb_EML located on the common hole transport layer HTR2, and the common electron transport layer ETR2. The second light emitting layer Gb_EML may emit the second color light (or the second green light) Lg2 being a light belonging to a green wavelength range. The second light emitting layer Gb_EML may be spaced from the first light emitting layer Ga_EML and the red and blue light emitting layers R_EML and B_EML in a plan view.

The second hybrid element HD_G2 may further include a second charge generating layer CGL2 located between the second light receiving stack O_ST2 and the second light emitting stack E_ST2. The second charge generating layer CGL2 may include a layer structure in which a second n-type charge generation layer n-CGL2 and a second p-type charge generation layer p-CGL2 are joined. According to some embodiments, the second n-type charge generation layer n-CGL2 may be located adjacent to the second light receiving stack O_ST2, and the second p-type charge generation layer p-CGL2 may be located adjacent to the second light emitting stack E_ST2.

Referring to FIG. 10A, in the light emitting mode, the first hybrid element HD_G1 may output the first color light (or first green light) Lg1, and the second hybrid element HD_G2 may output the second color light (or second green light) Lg2. The first hybrid element HD_G1 may output the first green light Lg1 through the first light emitting stack E_ST1.

In the light emitting mode, when the reverse bias is applied between the first hybrid anode electrode EL1_H1 and the cathode electrode EL2 of the first hybrid element HD_G1, a light may be emitted from the first light emitting stack E_ST1. In contrast, in the light emitting mode, the first light receiving stack O_ST1 may not operate and may be maintained in a turn-off state.

Referring to FIG. 10B, in the light receiving mode, the first hybrid element HD_G1 may output the first color light (or first green light) Lg1, and the second hybrid element HD_G2 may receive the first color light (or first green light) Lg1. The second hybrid element HD_G2 may receive the first color light (or first green light) Lg1 through the second light receiving stack O_ST2.

In the light receiving mode, the first green light Lg1 output from the first hybrid element HD_G1 may be reflected by the user's hand US_F and may be provided to the second light receiving stack O_ST2. In this case, when the forward bias is applied between the second hybrid anode electrode EL1_H2 and the cathode electrode EL2 of the second hybrid element HD_G2, the second photoelectric conversion layer OCL2 generates the electron (e) and the hole (h) based on the first color light (or first green light) Lg1. A potential of the first sensing node SN1 (refer to FIG. 5C) of the sensor circuit unit O_SD (refer to FIG. 5C) may be varied by the movement of the hole (h) and the electron (e) generated in the second light receiving stack O_ST2. In the light receiving mode, the readout circuit 500 (refer to FIG. 3) may detect the potential change of the first sensing node SN1 to sense the user's fingerprint. Meanwhile, in the light receiving mode, the second light emitting stack E_ST2 of the second hybrid element HD_G2 may not operate and may be maintained in a turn-off state.

Alternatively, in the light receiving mode, the second hybrid element HD_G2 may output the second color light (or second green light) Lg2, and the first hybrid element HD_G1 may receive the second color light (or second green light) Lg2. The first hybrid element HD_G1 may receive the second color light (or second green light) Lg2 through the first light receiving stack O_ST1. In this case, the first light emitting stack E_ST1 of the first hybrid element HD_G1 may not operate and may be maintained in a turn-off state.

According to some embodiments of the present disclosure, as some of light emitting elements (i.e., green light emitting elements) outputting the same color light are replaced with a hybrid element with a light emitting function and a light receiving function, there may be no need to add a separate light receiving element for recognizing biometric information to a display panel, except for light emitting elements. Accordingly, the display device may recognize biometric information without the decrease in the overall resolution of the display panel.

While the present disclosure has been described with reference to embodiments thereof, it will be apparent to those of ordinary skill in the art that various changes and modifications may be made thereto without departing from the spirit and scope of the present disclosure as set forth in the following claims, and their equivalents.

What is claimed is:

1. A display device comprising:
a base layer;
a circuit layer on the base layer; and
an element layer on the circuit layer and including a light emitting element and a hybrid element,
wherein the hybrid element includes:
a hybrid anode electrode;
a light receiving stack on the hybrid anode electrode;
a light emitting stack on the light receiving stack; and
a hybrid cathode electrode on the light emitting stack,
wherein the light emitting element is configured to be turned on to emit a first color light in a light emitting mode and a light receiving mode,
wherein the hybrid element is configured to be turned on to output a second color light in the light emitting mode,
wherein the hybrid element is configured to be turned on to receive the first color light in the light receiving mode, and
wherein the first color light and the second color light are lights having a same color wavelength range.

2. The display device of claim 1, wherein the light emitting element includes a first light emitting layer,
wherein the light receiving stack includes a photoelectric conversion layer, and
wherein the light emitting stack includes a second light emitting layer.

3. The display device of claim 2, wherein the light receiving stack further includes:
an electron blocking layer between the hybrid anode electrode and the photoelectric conversion layer;
a hole blocking layer between the photoelectric conversion layer and the second light emitting layer; and
an electron transport layer between the hole blocking layer and the second light emitting layer.

4. The display device of claim 3, wherein the electron blocking layer has a lowest unoccupied molecular orbital (LUMO) energy level higher than that of the photoelectric conversion layer, and
wherein the hole blocking layer has a highest occupied molecular orbital (HOMO) energy level lower than that of the photoelectric conversion layer.

5. The display device of claim 4, wherein an LUMO energy level difference of the electron blocking layer and the photoelectric conversion layer is in a range of 3.0 eV or more, and
wherein an HOMO energy level difference of the hole blocking layer and the photoelectric conversion layer is in a range of −3.0 eV or more.

6. The display device of claim 3, wherein the light emitting stack further includes:
a common hole transport layer between the electron transport layer and the second light emitting layer; and
a common electron transport layer between the second light emitting layer and the hybrid cathode electrode.

7. The display device of claim 2, wherein the hybrid element further includes:
a charge generating layer between the light receiving stack and the light emitting stack.

8. The display device of claim 7, wherein the charge generating layer includes:
an n-type charge generation layer on the light receiving stack; and
a p-type charge generation layer on the n-type charge generation layer.

9. The display device of claim 2, wherein the light emitting element further includes:

an anode electrode; and a cathode electrode, and wherein the first light emitting layer is between the anode electrode and the cathode electrode.

10. The display device of claim 9, wherein a distance between the anode electrode and the first light emitting layer is equal to a distance between the hybrid anode electrode and the second light emitting layer.

11. The display device of claim 10, wherein the first and second color lights are lights in a green wavelength range.

12. The display device of claim 10, further comprising:

a color filter layer on the element layer, wherein the color filter layer includes:

a first color filter corresponding to the light emitting element; and a second color filter corresponding to the hybrid element, and wherein the first and second color filters have a same color.

13. The display device of claim 1, wherein the light emitting element is identical to the hybrid element in size and in shape.

14. The display device of claim 1, wherein the circuit layer includes:

a pixel circuit connected to the light emitting element;

a pixel circuit unit connected to the hybrid element and being identical to the pixel circuit in circuit structure; and a sensor circuit unit connected to the hybrid element and the pixel circuit unit.

15. The display device of claim 14, wherein the sensor circuit unit includes:

a reset transistor including a first electrode configured to receive a reset voltage, a second electrode connected to the hybrid anode electrode, and a third electrode configured to receive a reset control signal;

an amplification transistor including a first electrode configured to receive a sensing driving voltage, a second electrode connected to the hybrid anode electrode, and a third electrode connected to a sensing node; and an output transistor including a first electrode connected to the sensing node, a second electrode connected to a readout line, and a third electrode configured to receive an output control signal.

16. An electronic device comprising:

a base layer;

a circuit layer on the base layer;

an element layer on the circuit layer and including a light emitting element and a hybrid element; and a color filter layer on the element layer and including a first color filter corresponding to the light emitting element and a second color filter corresponding to the hybrid element, wherein the circuit layer includes:

a pixel circuit connected to the light emitting element;

a pixel circuit unit connected to the hybrid element, the pixel circuit unit having a circuit structure identical to a circuit structure of the pixel circuit; and a sensor circuit unit connected to the hybrid element and the pixel circuit unit, and wherein the hybrid element includes:

a light emitting unit configured to be turned on by the pixel circuit unit in a reverse bias state; and a light receiving unit configured to be turned on by the sensor circuit unit in a forward bias state, wherein the first and second color filters have a same color.

17. The electronic device of claim 16, wherein the hybrid element includes:

a hybrid anode electrode;

a light receiving stack on the hybrid anode electrode;

a light emitting stack on the light receiving stack; and a hybrid cathode electrode on the light emitting stack.

18. The electronic device of claim 17, wherein the light emitting unit is defined by the hybrid anode electrode, the light emitting unit, and the hybrid cathode electrode, and wherein the light receiving unit is defined by the hybrid anode electrode, the light receiving stack, and the hybrid cathode electrode.

19. The electronic device of claim 18, wherein the light emitting element is configured to be turned on to emit a first color light in a light emitting mode and a light receiving mode, wherein the light emitting unit of the hybrid element is configured to output a second color light in the light emitting mode, and wherein the light receiving unit of the hybrid element is configured to receive the first color light in the light receiving mode.

* * * * *